(12) United States Patent
Tang et al.

(10) Patent No.: US 11,769,342 B2
(45) Date of Patent: Sep. 26, 2023

(54) OPTICAL FINGERPRINT IDENTIFICATION SYSTEM AND OPTICAL FINGERPRINT IDENTIFICATION DEVICE

(71) Applicant: LARGAN PRECISION CO., LTD., Taichung (TW)

(72) Inventors: Hsiang-Chi Tang, Taichung (TW); Chun-Che Hsueh, Taichung (TW); Tsung-Han Tsai, Taichung (TW); Fuh-Shyang Yang, Taichung (TW)

(73) Assignee: LARGAN PRECISION CO., LTD., Taichung (TW)

( * ) Notice: Subject to any disclaimer, the term of this patent is extended or adjusted under 35 U.S.C. 154(b) by 191 days.

(21) Appl. No.: 17/076,671

(22) Filed: Oct. 21, 2020

(65) Prior Publication Data

US 2022/0036029 A1 Feb. 3, 2022

(30) Foreign Application Priority Data

Jul. 30, 2020 (TW) .................................. 109125829

(51) Int. Cl.
*G06V 40/13* (2022.01)
*H01L 27/146* (2006.01)
(Continued)

(52) U.S. Cl.
CPC ....... *G06V 40/1318* (2022.01); *G02B 3/0087* (2013.01); *G02B 5/003* (2013.01); *G02B 5/28* (2013.01); *G02B 19/0076* (2013.01); *G02B 27/30* (2013.01); *H01L 27/1462* (2013.01); *H01L 27/14627* (2013.01); *H01L 27/14678* (2013.01); *G02B 3/08* (2013.01)

(58) Field of Classification Search
CPC ............. G06K 9/0004; G06V 40/1318; G06V 40/1324; H01L 27/3227; H01L 27/3234
See application file for complete search history.

(56) References Cited

U.S. PATENT DOCUMENTS 8,842,367 B2 9/2014 Chen
9,225,888 B2 12/2015 Huang
(Continued)

FOREIGN PATENT DOCUMENTS

CN 206470775 U * 9/2017 ............... G06K 9/00
CN 107341472 B 12/2019
(Continued)

OTHER PUBLICATIONS

Taiwan Office Action dated Sep. 23, 2021 as received in application No. 109125829.

*Primary Examiner* — Yuzhen Shen
(74) *Attorney, Agent, or Firm* — Maschoff Brennan

(57) ABSTRACT

An optical fingerprint identification system includes a base, a photo sensor, a light emitting layer and a cover. The photo sensor is disposed on the base. The light emitting layer is disposed above the photo sensor, and the light emitting layer includes a light emitting element. The cover is disposed above the light emitting layer. The optical fingerprint identification system further includes a light path adjusting element between the photo sensor and the cover. The light emitting element is disposed away from the light path adjusting element and the photo sensor in a sideway direction that is different from a stack direction of the optical fingerprint identification system.

22 Claims, 16 Drawing Sheets

(51) Int. Cl.
*G02B 27/30* (2006.01)
*G02B 5/28* (2006.01)
*G02B 5/00* (2006.01)
*G02B 3/00* (2006.01)
*G02B 19/00* (2006.01)
*G02B 3/08* (2006.01)

(56) References Cited

U.S. PATENT DOCUMENTS

| | | | |
|---|---|---|---|
| 9,279,964 B2 | 3/2016 | Hsiao et al. | |
| 9,829,614 B2 | 11/2017 | Smith et al. | |
| 10,181,070 B2 | 1/2019 | Smith et al. | |
| 10,268,884 B2 | 4/2019 | Jones | |
| 10,311,276 B2 | 6/2019 | Mackey et al. | |
| 10,410,037 B2 | 9/2019 | He et al. | |
| 10,515,253 B2 | 12/2019 | Chen et al. | |
| 2006/0267508 A1* | 11/2006 | Sun | G09G 3/3233 315/169.3 |
| 2008/0121442 A1* | 5/2008 | Boer | G06V 40/1318 178/18.09 |
| 2013/0240714 A1* | 9/2013 | Higashitsutsumi | H04N 5/2257 250/208.1 |
| 2017/0352695 A1* | 12/2017 | Tsuchiya | H01L 27/15 |
| 2018/0012069 A1 | 1/2018 | Chung et al. | |
| 2018/0366593 A1 | 12/2018 | Huang et al. | |
| 2019/0026530 A1* | 1/2019 | Wu | H01L 27/146 |
| 2019/0180072 A1* | 6/2019 | Fomani | G06V 40/1324 |
| 2019/0228203 A1* | 7/2019 | Kim | G06V 40/1329 |
| 2019/0278968 A1 | 9/2019 | Yoshii et al. | |
| 2019/0384959 A1* | 12/2019 | Lee | G09G 3/3233 |
| 2020/0065550 A1 | 2/2020 | He et al. | |
| 2020/0203405 A1* | 6/2020 | Lee | H01L 27/14645 |
| 2021/0089741 A1* | 3/2021 | Yeh | G06F 3/044 |
| 2021/0232794 A1* | 7/2021 | Lius | H01L 31/143 |
| 2021/0271003 A1* | 9/2021 | Yang | G06V 40/12 |
| 2021/0296409 A1* | 9/2021 | Yamazaki | H05B 33/12 |

FOREIGN PATENT DOCUMENTS

| | | | | |
|---|---|---|---|---|
| CN | 111007680 A | * | 4/2020 | G02B 6/0053 |
| TW | I627590 | | 6/2018 | |
| TW | M561810 | | 6/2018 | |
| WO | WO-2021212946 A1 | * | 10/2021 | G02F 1/13338 |

\* cited by examiner

OPTICAL FINGERPRINT IDENTIFICATION SYSTEM AND OPTICAL FINGERPRINT IDENTIFICATION DEVICE

RELATED APPLICATIONS

This application claims priority to Taiwan Application 109125829, filed on Jul. 30, 2020, which is incorporated by reference herein in its entirety.

BACKGROUND

Technical Field

The present disclosure relates to an optical fingerprint identification system and an optical fingerprint identification device, more particularly to an optical fingerprint identification system applicable to an optical fingerprint identification device.

Description of Related Art

Nowadays, smart mobile devices become more popular than ever. Users can access vast amount of data via smart mobile devices, and these data may refer to personal information. Therefore, data security of smart mobile devices needs to be significantly raised. Currently, there are many types of security systems provided on smart mobile devices on the market, such as graphical password authentication, fingerprint identification and facial recognition systems, among which the fingerprint identification system is most commonly used. Conventionally, a capacitive device is widely used in the fingerprint identification system; but as for now, in order to follow the trend of high screen-to-body ratio of smart mobile devices, the in-display fingerprint identification system rapidly develops. There are two types of in-display fingerprint identification systems: optical and ultrasonic. Between the two types, the optical type has advantages of high identification accuracy and high compatibility with smart mobile devices, thereby the adoption of the optical type becoming widespread.

The optical type of the in-display fingerprint identification system is usually disposed under the screen. The screen can be a light source to emit light onto user's fingerprint, and then the light can be reflected to a photo sensor disposed under the screen, such that the user's fingerprint can be sensed, recorded and then identified. However, this configuration may also capture many unwanted images of elements in the screen modules when capturing a fingerprint image. These unwanted images may easily generate "Moiré effect", which causes poor fingerprint image quality and thus increases difficulty of fingerprint identification.

SUMMARY

According to one aspect of the present disclosure, an optical fingerprint identification system includes a base, a photo sensor, a light emitting layer and a cover. The photo sensor is disposed on the base. The light emitting layer is disposed above the photo sensor, and the light emitting layer includes a light emitting element. The cover is disposed above the light emitting layer. The optical fingerprint identification system further includes a light path adjusting element between the photo sensor and the cover. The light emitting element is disposed away from the light path adjusting element and the photo sensor in a sideway direction that is different from a stack direction of the optical fingerprint identification system.

According to another aspect of the present disclosure, an optical fingerprint identification device includes a plurality of light emitting elements, a plurality of light path adjusting elements and a plurality of photo sensors. The plurality of light emitting elements are disposed at equal intervals respectively in a first direction and a second direction, wherein the first direction is substantially perpendicular to the second direction. The plurality of light path adjusting elements are located above the plurality of light emitting elements in a stack direction of the optical fingerprint identification device, the plurality of light path adjusting elements are disposed at equal intervals in the first direction, and each of the plurality of light path adjusting elements is located between two adjacent light emitting elements of the plurality of light emitting elements in the first direction, wherein the stack direction is substantially perpendicular to the first direction and the second direction. The plurality of photo sensors are located below the plurality of light emitting elements in the stack direction, the plurality of photo sensors are disposed at equal intervals in the first direction, and each of the plurality of photo sensors is located between two adjacent light emitting elements of the plurality of light emitting elements in the first direction.

BRIEF DESCRIPTION OF THE DRAWINGS

The disclosure can be better understood by reading the following detailed description of the embodiments, with reference made to the accompanying drawings as follows:

FIG. 4b is a top view of a collimator unit of the optical fingerprint identification system of FIG. 4a;

DETAILED DESCRIPTION

Figure 1:
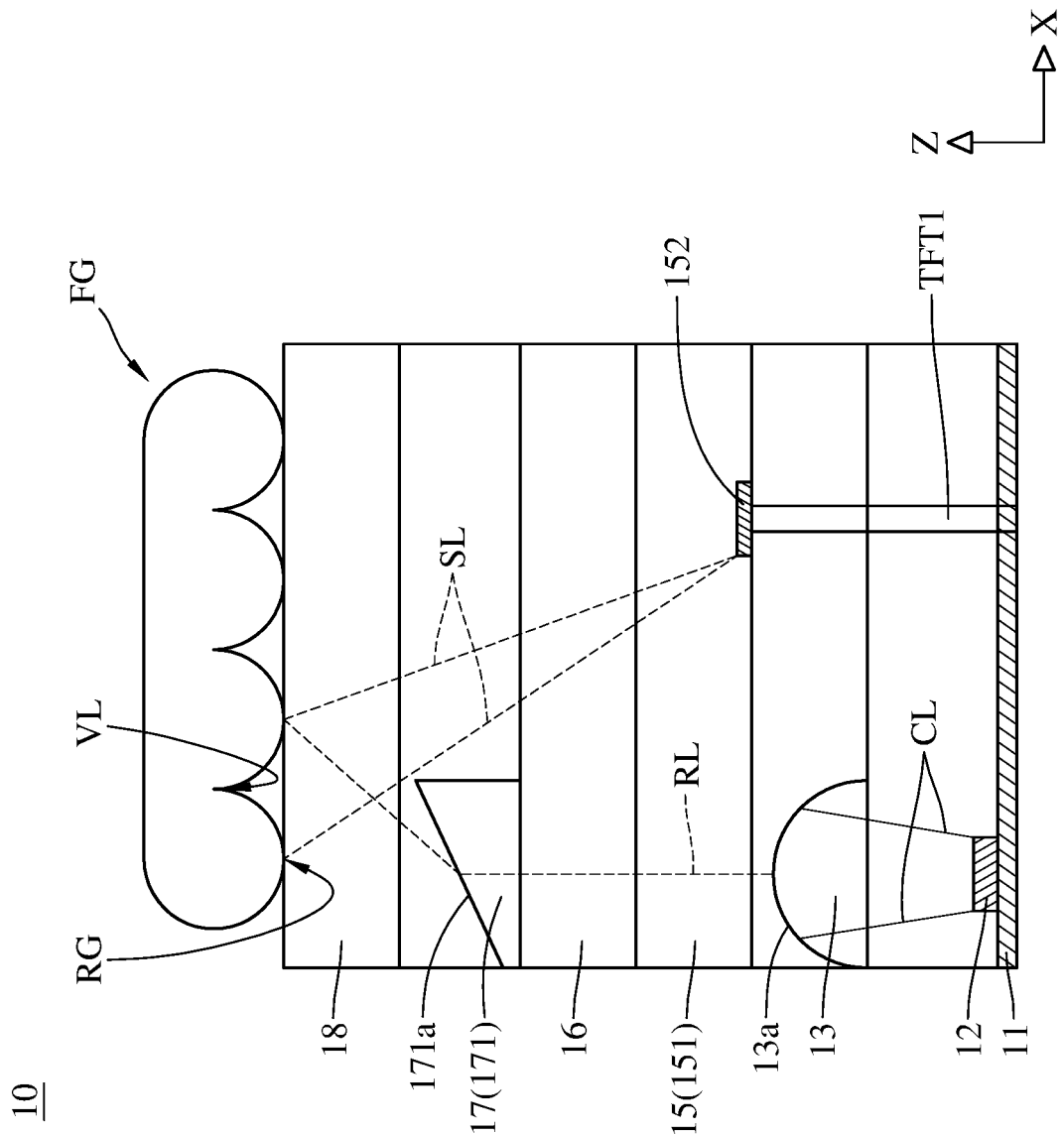
FIG. 1 is a schematic view of an optical fingerprint identification system according to the 1st embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The present disclosure provides an optical fingerprint identification system including a base, a photo sensor, a light emitting layer and a cover. The photo sensor is disposed on the base. The light emitting layer is disposed above the photo sensor, and the light emitting layer includes a light emitting element. The cover is disposed above the light emitting layer. The optical fingerprint identification system further includes a light path adjusting element between the photo sensor and the cover. The light emitting element is disposed away from the light path adjusting element and the photo sensor in a sideway direction that is different from a stack direction of the optical fingerprint identification system. This configuration is favorable for preventing capturing an unwanted image of the light emitting element under the screen when capturing a fingerprint image and is also favorable with the light path adjusting element for changing the light path, thereby effectively increasing fingerprint image quality, reducing difficulty and time of fingerprint identification for increasing identification accuracy. In the present disclosure, the light path adjusting element refers to an element capable of altering the light path so as to reduce the angle between the light path and the normal line of the photo sensor.

The light path adjusting element can include a wedge prism. Therefore, it is favorable for redirecting the optical path.

According to the present disclosure, the optical fingerprint identification system can further include a condenser lens element disposed above the photo sensor and below the light path adjusting element. Therefore, it is favorable for providing a proper light transmission medium to reduce the optical path and the configuration thickness, thereby being applicable to thin electronic devices.

According to the present disclosure, the optical fingerprint identification system can further include a condenser medium layer disposed below the condenser lens element and above the photo sensor. Therefore, it is favorable for eliminating the coaxial requirement between lens elements so as to reduce the difficulty of the overall manufacturing process.

When a refractive index of the condenser medium layer is nA, the following condition can be satisfied: $1.60 < nA < 5.0$. Therefore, it is favorable for providing sufficient refractive power so as to reduce the total track length. Moreover, a proper condenser medium layer material can be chosen based on the light convergence capability and manufacture difficulty, and thus the following condition can also be satisfied: $nA = 1.62$. Moreover, the following condition can also be satisfied: $nA = 1.77$. Moreover, the following condition can also be satisfied: $nA = 2.01$.

According to the present disclosure, the optical fingerprint identification system can further include a collimator unit disposed above the photo sensor and below the light path adjusting element, and the collimator unit has a plurality of tubular holes. Therefore, it is favorable for receiving non-axially aligned light rays to effectively guide and adjust the optical path, thereby increasing the total amount of incident light on the photo sensor as well as fingerprint image quality.

The collimator unit can include a reflective layer disposed on each inner wall of the collimator unit to surround each of the plurality of tubular holes. Therefore, it is favorable for utilizing the reflective layer on the inner walls of the tubular holes to reflect non-axially aligned light rays, thereby enhancing the reception of slanted light and thus increasing the total amount of incident light into the photo sensor.

Figure 14:
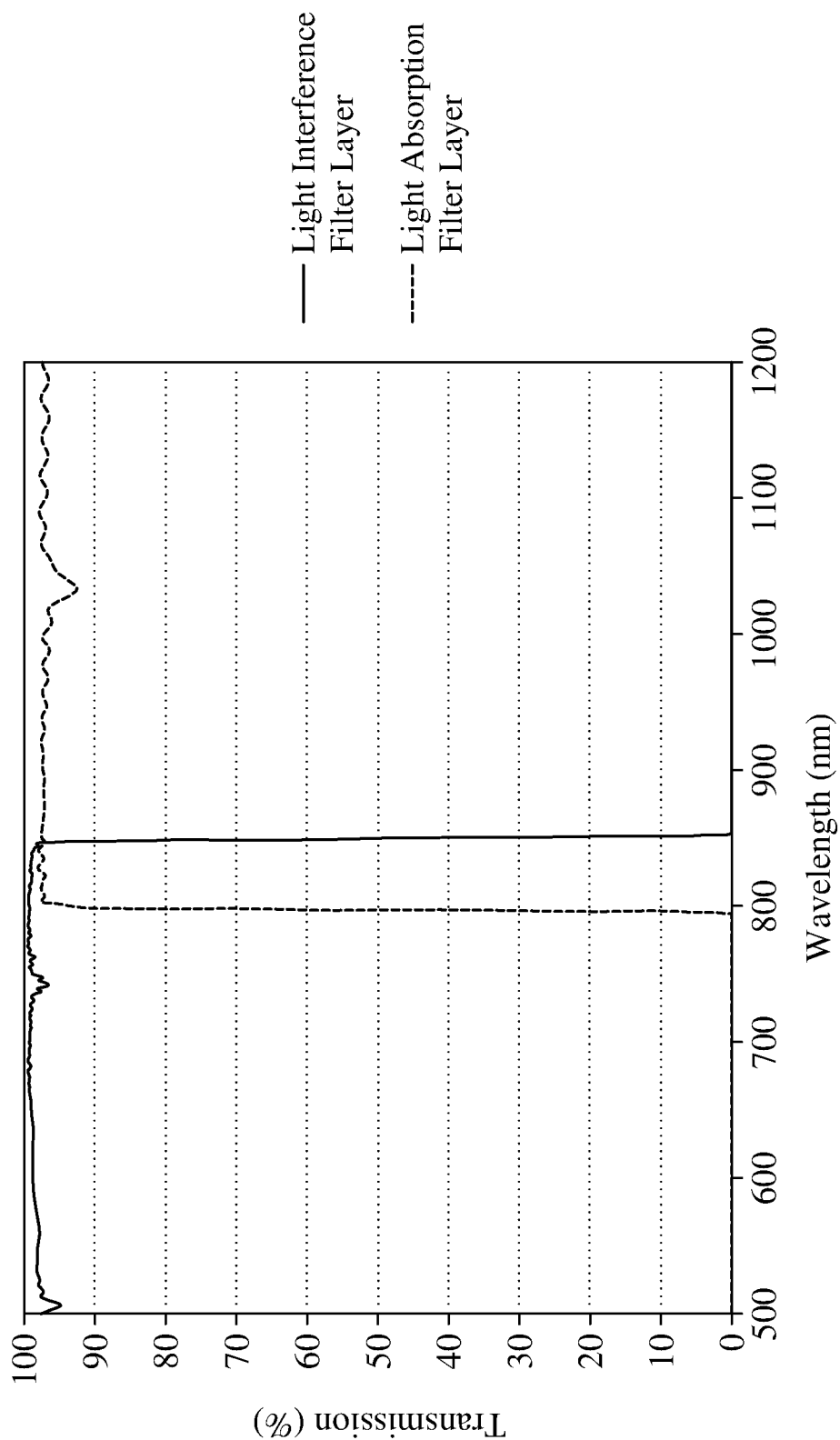
FIG. 14 is a chart showing wavelengths and transmissions of light at an incident angle of 0 degree on a light interference filter layer passing through the light interference filter layer and a light absorption filter layer according to one embodiment of the present disclosure.
Figure 15:
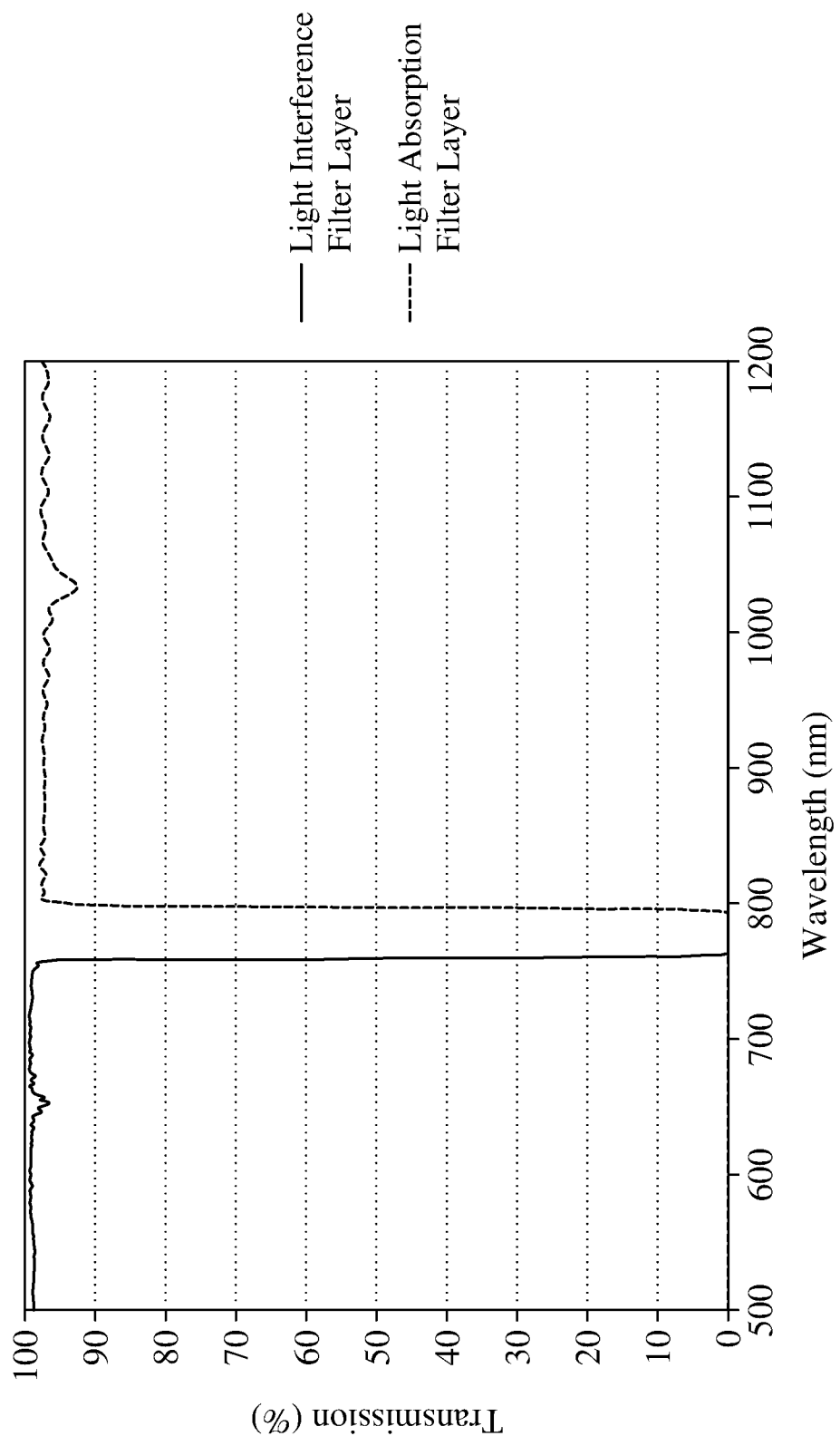
FIG. 15 is a chart showing wavelengths and transmissions of light at an incident angle of 45 degrees on a light interference filter layer passing through the light interference filter layer and a light absorption filter layer according to one embodiment of the present disclosure.

According to the present disclosure, the optical fingerprint identification system can further include a light interference filter layer and a light absorption filter layer that are disposed above the photo sensor and below the light path adjusting element. The light interference filter layer and the light absorption filter layer can be two edgepass filter layers coupled together or two bandpass filter layers. The light interference filter layer and the light absorption filter layer can be two filter medium layers or can be formed by plating filter medium on light-permeable elements. The light interference filter layer can provide a filter bandwidth shift according to a change of an incident light angle thereon, and the light absorption filter layer can be a light passable filter layer. The combination of the light interference filter layer and the light absorption filter layer is favorable for filtering light at an overly large incident angle so as to eliminate image noises. Moreover, the light absorption filter layer has a light passable bandwidth ranging between visible and near-infrared spectrum. Please refer to FIG. 14 and FIG. 15. FIG. 14 is a line chart showing wavelengths and transmissions of light at a vertical incident angle (incident angle of 0 degree) on the light interference filter layer passing through the light interference filter layer and the light absorption filter layer according to one embodiment of the present disclosure. FIG. 15 is a line chart showing wavelengths and transmissions of light at an incident angle of 45 degrees on the light interference filter layer passing through the light interference filter layer and the light absorption filter layer according to one embodiment of the present disclosure, wherein the horizontal axis of the line chart refers to light wavelengths in nanometer (nm), and the vertical axis of the line chart refers to light transmissions in percentage (%). In the embodiment of FIG. 14 and FIG. 15, the light interference filter layer and the light absorption filter layer are two edgepass filter layers coupled together, wherein the light interference filter layer is a short pass filter layer, and the light absorption filter layer is a long pass filter layer. As shown in FIG. 14 and FIG. 15, the wavelengths of light capable of passing through the light interference filter layer and the light absorption filter layer are different according to different incident light angles on the light interference filter layer. In detail, please refer to FIG. 14, when light is at a vertical incident angle, light with a wavelength below approximately 850 nm (the upper limit of short pass) can pass through the light interference filter layer, while light with a wavelength above approximately 800 nm (the lower limit of long pass) can pass through the light absorption filter layer. That is, when light is in a vertical incident angle, light with a wavelength ranging between approximately 800 nm and approximately 850 nm (near-infrared light) can pass through the light interference filter layer and the light absorption filter layer. Then, please refer to FIG. 15; when light is at an incident angle of 45 degrees, only light with a wavelength below approximately 760 nm can pass through the light interference filter layer due to the overly large incident angle thereof. Comparing the lines in the line charts of FIG. 14 and FIG. 15, the line of FIG. 15 showing wavelengths of light capable of passing through the light interference filter layer shifts more left than the line of FIG. 14, which is regarded as the abovementioned filter bandwidth shift. However, when light is at an incident angle of 45 degrees, the line of FIG. 15 showing wavelengths of light capable of passing through the light absorption filter layer is substantially the same as the line of FIG. 14. As shown in FIG. 15, the wavelengths of light capable of passing through the light interference filter layer and the wavelengths of light capable of passing through the light absorption filter layer do not have any overlapped region. Therefore, light at an incident angle of 45 degrees cannot pass through the light interference filter layer and the light absorption filter layer at the same time, and thereby it is favorable for achieving the abovementioned effect of filtering light at an overly large incident angle.

When a full width at half maximum of a bandwidth of light passing through the light interference filter layer and the light absorption filter layer is FWHM, the following condition can be satisfied: FWHM<100 [nm]. Therefore, it is favorable for restricting the range of the light passable bandwidth so as to control the light incident angle. Moreover, the following condition can also be satisfied: FWHM<50 [nm]. In the present disclosure, a bandwidth of light capable of passing through the light interference filter layer and a bandwidth of light capable of passing through the light absorption filter layer has an overlapping range that is the abovementioned bandwidth of light passing through the light interference filter layer and the light absorption filter layer. Taking the embodiment of FIG. 14 as an example, the bandwidth of light passing through the light interference filter layer and the light absorption filter layer is the wavelength ranging between approximately 800 nm and approximately 850 nm, but the present disclosure is not limited thereto.

The light path adjusting element can include a gradient refractive index (GRIN) element. Therefore, it is favorable for redirecting the optical path. Moreover, the gradient refractive index element can refer to a radial gradient index lens.

A refractive index of the gradient refractive index element can gradually decrease in a direction away from the light emitting element. Therefore, it is favorable for effectively controlling the optical path direction.

When a maximum refractive index of the gradient refractive index element is Nmax, and a minimum refractive index of the gradient refractive index element is Nmin, the following condition can be satisfied: 1.2<Nmax/Nmin<4.5. Therefore, it is favorable for obtaining a balance between the refraction capability and manufacturing difficulty of the gradient refractive index element.

The light path adjusting element can include at least two medium layers, and there can be an inclined surface connected to and located between two adjacent layers of the at least two medium layers. Therefore, it is favorable for redirecting the optical path by the material difference of the two adjacent layers of the at least two medium layers and the slope of the inclined surface.

One of the at least two medium layers disposed further away from the light emitting element than the other of the at least two medium layers has a lower refractive index than that of the other of the at least two medium layers. That is, the medium layer of the at least two medium layers furthest away from the light emitting element has the smallest refractive index; in addition, the medium layer of the at least two medium layers closest to the light emitting element has the largest refractive index. Therefore, it is favorable for controlling the optical path direction so as to effectively increasing the energy of collimated light.

The inclined surface can be a total reflection surface. The total reflection effect can be achieved by configuring different materials of the two adjacent layers of the at least two medium layers or directly configuring a reflection medium coating on the inclined surface. Therefore, it is favorable for effectively controlling the optical path direction and creating the total reflection surface by adjusting the slope of the inclined surface, thereby reducing light energy loss due to light penetration or refraction and thus increasing the energy of collimated light.

The light emitting element can be disposed away from the light path adjusting element and the photo sensor in the sideway direction. Therefore, it is favorable for the light path adjusting element and the photo sensor to form an image identification unit, which is easily to be combined into one module. Moreover, the light emitting element can also be disposed away from the light path adjusting element, the condenser lens element and the photo sensor in the sideway direction. Therefore, it is favorable for incorporating the condenser lens element into the image identification unit so as to enhance the combined module.

According to the present disclosure, the optical fingerprint identification system can further include a wafer level lens assembly disposed above the photo sensor and below the light path adjusting element. Therefore, it is favorable for effectively providing better light convergence so as to reduce the thickness of the optical fingerprint identification system.

According to the present disclosure, the optical fingerprint identification system can further include a metalens element disposed above the photo sensor and below the light path adjusting element. Therefore, it is favorable for effectively improve light convergence so as to reduce the thickness of the optical fingerprint identification system.

According to the present disclosure, the optical fingerprint identification system can further include a light absorption layer that surrounds an outer rim of the light path adjusting element. Therefore, it is favorable for preventing the light emitting element from projecting too much stray light on the light path adjusting element.

The light path adjusting element and the photo sensor are substantially aligned in the stack direction of the optical fingerprint identification system. In other words, the light path adjusting element has an orthographic projection on the base overlapping with an orthographic projection of the photo sensor on the base. Therefore, it is favorable for providing light with an incident angle closer to normal for the photo sensor so as to enhance the response of the photo sensor.

The light emitting layer can further include a display unit, wherein the display unit includes the light emitting element, and the light emitting element comprises an organic light emitting diode (OLED). Therefore, it is favorable for reducing the overall configuration thickness so as to achieve the configuration of an in-display fingerprint identification system.

The light emitting element and the photo sensor the can be connected via a thin-film-transistor (TFT) circuitry structure. Therefore, it is favorable for synchronously activating the light emitting element and the photo sensor via the aforementioned connection so as to easily control emission and retrieval of light, thereby eliminating unwanted optical signal noise and crosstalk, thus increasing identification accuracy. Moreover, there can be a plurality of photo sensors to form an image sensor with complementary metal-oxide-semiconductors (CMOSs). Therefore, it is favorable for allowing light passing through an optical element to form images on the plurality of photo sensors.

The light emitting element can emit red light or green light. Therefore, it is favorable for providing information of photoplethysmogram so as to confirm the identified object is from a live person.

According to the present disclosure, the optical fingerprint identification system can further include a touch layer located between the light path adjusting element and the photo sensor, and the touch layer can be disposed above, below or in the structure of the light emitting layer. Therefore, it is favorable for providing a touch function and confirming the fingerprint being identified is from a live person.

The light path adjusting element can include a Fresnel lens element. The Fresnel lens element has a plurality of miniature inclined surfaces that can correspond to different fields of view, and the incline direction of the plurality of miniature inclined surfaces is substantially the same as the incline direction of the inclined surface of the wedge prism included in the abovementioned light path adjusting element.

The present disclosure provides an optical fingerprint identification device including a plurality of light emitting elements, a plurality of light path adjusting elements and a plurality of photo sensors. The plurality of light emitting elements are disposed at equal intervals respectively in a first direction and a second direction, wherein the first direction is substantially perpendicular to the second direction. The plurality of light path adjusting elements are located above the plurality of light emitting elements in a stack direction of the optical fingerprint identification device, the plurality of light path adjusting elements are disposed at equal intervals in the first direction, and each of the plurality of light path adjusting elements is located between two adjacent light emitting elements of the plurality of light emitting elements in the first direction, wherein the stack direction is substantially perpendicular to the first direction and the second direction. The plurality of photo sensors are located below the plurality of light emitting elements in the stack direction, the plurality of photo sensors are disposed at equal intervals in the first direction, and each of the plurality of photo sensors is located between two adjacent light emitting elements of the plurality of light emitting elements in the first direction. This configuration of an optical array is favorable for reducing the overall size of the optical fingerprint identification device so as to provide high compatibility with the current display manufacturing process.

The light path adjusting element and the photo sensor are substantially aligned in the stack direction of the optical fingerprint identification device. In other words, the position of the light path adjusting element respectively corresponds to the position of the photo sensor in the stack direction. Therefore, it is favorable for sufficiently providing light with an incident angle closer to normal for the photo sensor so as to enhance the response of the photo sensor.

According to the present disclosure, the optical fingerprint identification device can further include a collimator layer disposed above the plurality of photo sensors and below the plurality of light path adjusting elements, and the collimator layer has a plurality of tubular holes. Therefore, it is favorable for effectively guiding light and adjusting the optical path direction, thereby increasing the total incident light on the photo sensor and fingerprint image quality.

According to the present disclosure, the aforementioned features and conditions can be utilized in numerous combinations so as to achieve corresponding effects.

According to the above description of the present disclosure, the following specific embodiments are provided for further explanation.

1st Embodiment

Please refer to FIG. 1, which is a schematic view of an optical fingerprint identification system according to the 1st embodiment of the present disclosure. In this embodiment, the optical fingerprint identification system 10 includes a base 11, a photo sensor 12, a condenser lens element 13, a light emitting layer 15, a touch layer 16, a light path adjusting element 17 and a cover 18. The photo sensor 12 is disposed on the base 11 in a stack direction Z. The condenser lens element 13 is disposed above the photo sensor 12 in the stack direction Z. The light emitting layer 15 is disposed above the photo sensor 12 and the condenser lens element 13 in the stack direction Z. The touch layer 16 is disposed above the light emitting layer 15 in the stack direction Z. The light path adjusting element 17 is disposed above the photo sensor 12, the condenser lens element 13, the light emitting layer 15 and the touch layer 16 in the stack direction Z, such that the touch layer 16 is located between the photo sensor 12 and the light path adjusting element 17. The cover 18 is disposed above the light emitting layer 15 and the light path adjusting element 17 in the stack direction Z.

Specifically, the condenser lens element 13 is located above the photo sensor 12 and below the light path adjusting element 17. The condenser lens element 13 has a convex lens surface 13a facing the light path adjusting element 17 in the stack direction Z.

The light emitting layer 15 includes a display unit 151, and the display unit 151 includes a light emitting element 152. The light emitting element 152 is disposed away from the photo sensor 12, the condenser lens element 13 and the light path adjusting element 17 in a sideway direction that is different from the stack direction Z. Specifically, the light emitting element 152 is disposed away from the photo sensor 12, the condenser lens element 13 and the light path adjusting element 17 in a first direction X that is the same as the sideway direction.

The light emitting element 152 comprises an organic light emitting diode and thus can be used as a light source to emit red light or green light. The light emitting element 152 and the base 11 are connected via a thin-film-transistor circuitry structure TFT1, and the light emitting element 152 and the photo sensor 12 are indirectly connected via the thin-film-transistor circuitry structure TFT1 and the base 11.

The light path adjusting element 17 is located between the photo sensor 12 and the cover 18. The light path adjusting element 17 and the photo sensor 12 are substantially aligned in the stack direction Z. In other words, the light path adjusting element 17 has an orthographic projection on the base 11 overlapping with an orthographic projection of the photo sensor 12 on the base 11. The light path adjusting element 17 includes a wedge prism 171. The wedge prism 171 has an inclined surface 171a facing the cover 18 in the stack direction Z.

When user's finger FG is placed on the cover 18, the light emitting element 152 can emit a sensing light SL towards the finger FG. The finger FG has fingerprint patterns, and the finger FG has a valley portion VL and a ridge portion RG on the surface thereof. The sensing light SL can be reflected off the valley portion VL and the ridge portion RG (for simplicity, only the sensing light SL reflected off the ridge portions RG are illustrated in the drawings of this and the following embodiments) and then transmitted to the inclined surface 171a of the wedge prism 171 to become a deflected light RL, wherein an angle between the deflected light RL and the normal line (not shown, which is a line parallel to the stack direction Z) of the photo sensor 12 is smaller than an angle between the sensing light SL and the normal line of the photo sensor 12. Then, the deflected light RL is transmitted to the convex lens surface 13a of the condenser lens element 13 to become a converging light CL towards the photo sensor 12. The converging light CL is imaged on the photo sensor 12 to generate image data, and the image data is transmitted to a processor (not shown). Image data of several optical fingerprint identification systems would be collected to form an image for the processor to perform an identification process.

2nd Embodiment

Figure 2:
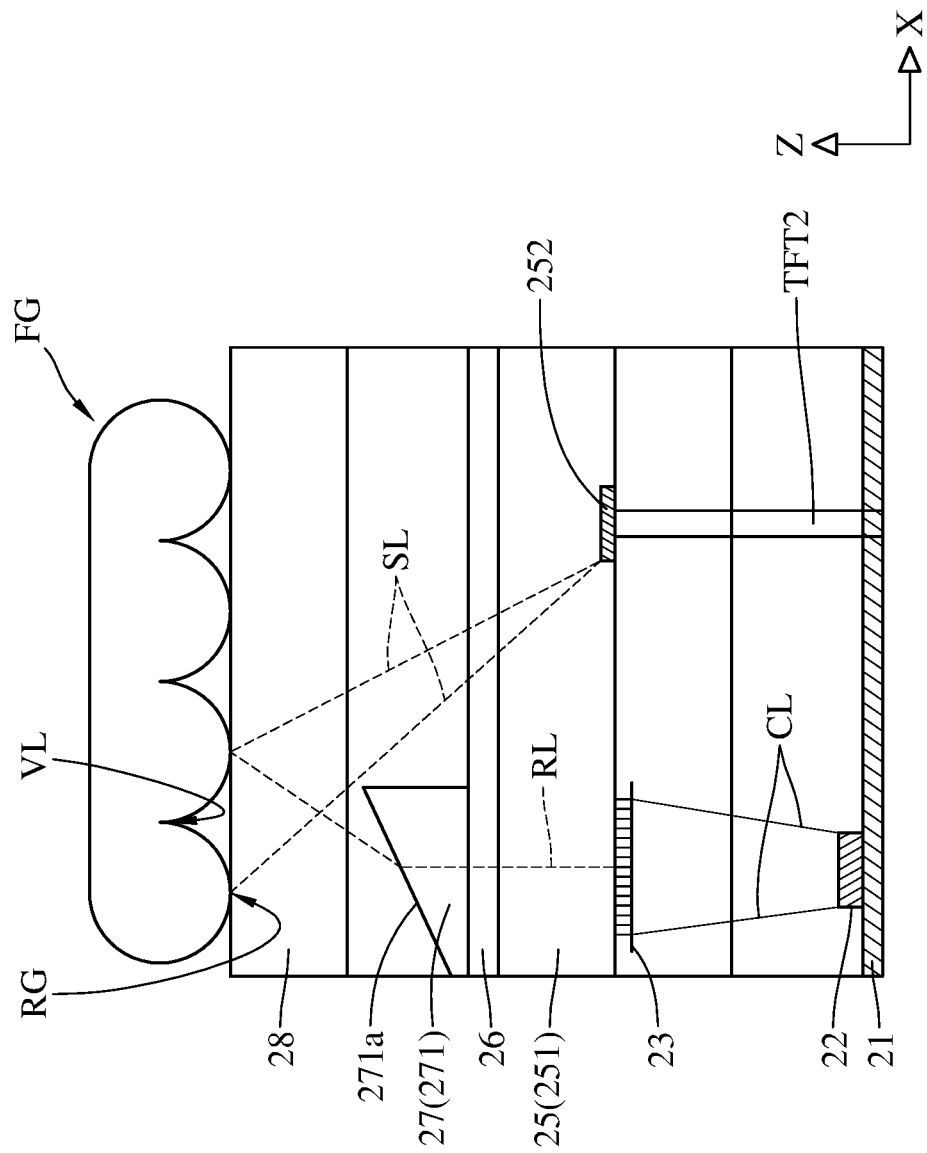
FIG. 2 is a schematic view of an optical fingerprint identification system according to the 2nd embodiment of the present disclosure.

Please refer to FIG. 2, which is a schematic view of an optical fingerprint identification system according to the 2nd embodiment of the present disclosure. In this embodiment, the optical fingerprint identification system 20 includes a base 21, a photo sensor 22, a metalens element 23, a light emitting layer 25, a touch layer 26, a light path adjusting element 27 and a cover 28. The photo sensor 22 is disposed on the base 21 in a stack direction Z. The metalens element 23 is disposed above the photo sensor 22 in the stack direction Z. The light emitting layer 25 is disposed above the photo sensor 22 and the metalens element 23 in the stack direction Z. The touch layer 26 is disposed into the structure of the light emitting layer 25 and thus located in the same layer as the light emitting layer 25. The light path adjusting element 27 is disposed above the photo sensor 22, the metalens element 23, the light emitting layer 25 and the touch layer 26 in the stack direction Z, such that the touch layer 26 is located between the photo sensor 22 and the light path adjusting element 27. The cover 28 is disposed above the light emitting layer 25 and the light path adjusting element 27 in the stack direction Z.

Specifically, the metalens element 23 is located above the photo sensor 22 and below the light path adjusting element 27.

The light emitting layer 25 includes a display unit 251, and the display unit 251 includes a light emitting element 252. The light emitting element 252 is disposed away from the photo sensor 22, the metalens element 23 and the light path adjusting element 27 in a sideway direction that is different from the stack direction Z. Specifically, the light emitting element 252 is disposed away from the photo sensor 22, the metalens element 23 and the light path adjusting element 27 in a first direction X that is the same as the sideway direction.

The light emitting element 252 comprises an organic light emitting diode and thus can be used as a light source to emit red light or green light. The light emitting element 252 and the base 21 are connected via a thin-film-transistor circuitry structure TFT2, and the light emitting element 252 and the photo sensor 22 are indirectly connected via the thin-film-transistor circuitry structure TFT2 and the base 21.

The light path adjusting element 27 is located between the photo sensor 22 and the cover 28. The light path adjusting element 27 and the photo sensor 22 are substantially aligned in the stack direction Z. In other words, the light path adjusting element 27 has an orthographic projection on the base 21 overlapping with an orthographic projection of the photo sensor 22 on the base 21. The light path adjusting element 27 includes a wedge prism 271. The wedge prism 271 has an inclined surface 271a facing the cover 28 in the stack direction Z.

When user's finger FG is placed on the cover 28, the light emitting element 252 can emit a sensing light SL towards the finger FG. The finger FG has fingerprint patterns, and the finger FG has a valley portion VL and a ridge portion RG on the surface thereof. The sensing light SL can be reflected off the valley portion VL and the ridge portion RG and then transmitted to the inclined surface 271a of the wedge prism 271 to become a deflected light RL, wherein an angle between the deflected light RL and the normal line (not shown, which is a line parallel to the stack direction Z) of the photo sensor 22 is smaller than an angle between the sensing light SL and the normal line of the photo sensor 22. Then, the deflected light RL is transmitted to the metalens element 23 to become a converging light CL towards the photo sensor 22. The converging light CL is imaged on the photo sensor 22 to generate image data, and the image data is transmitted to a processor (not shown). Image data of several optical fingerprint identification systems would be collected to form an image for the processor to perform an identification process.

3rd Embodiment

Figure 3:
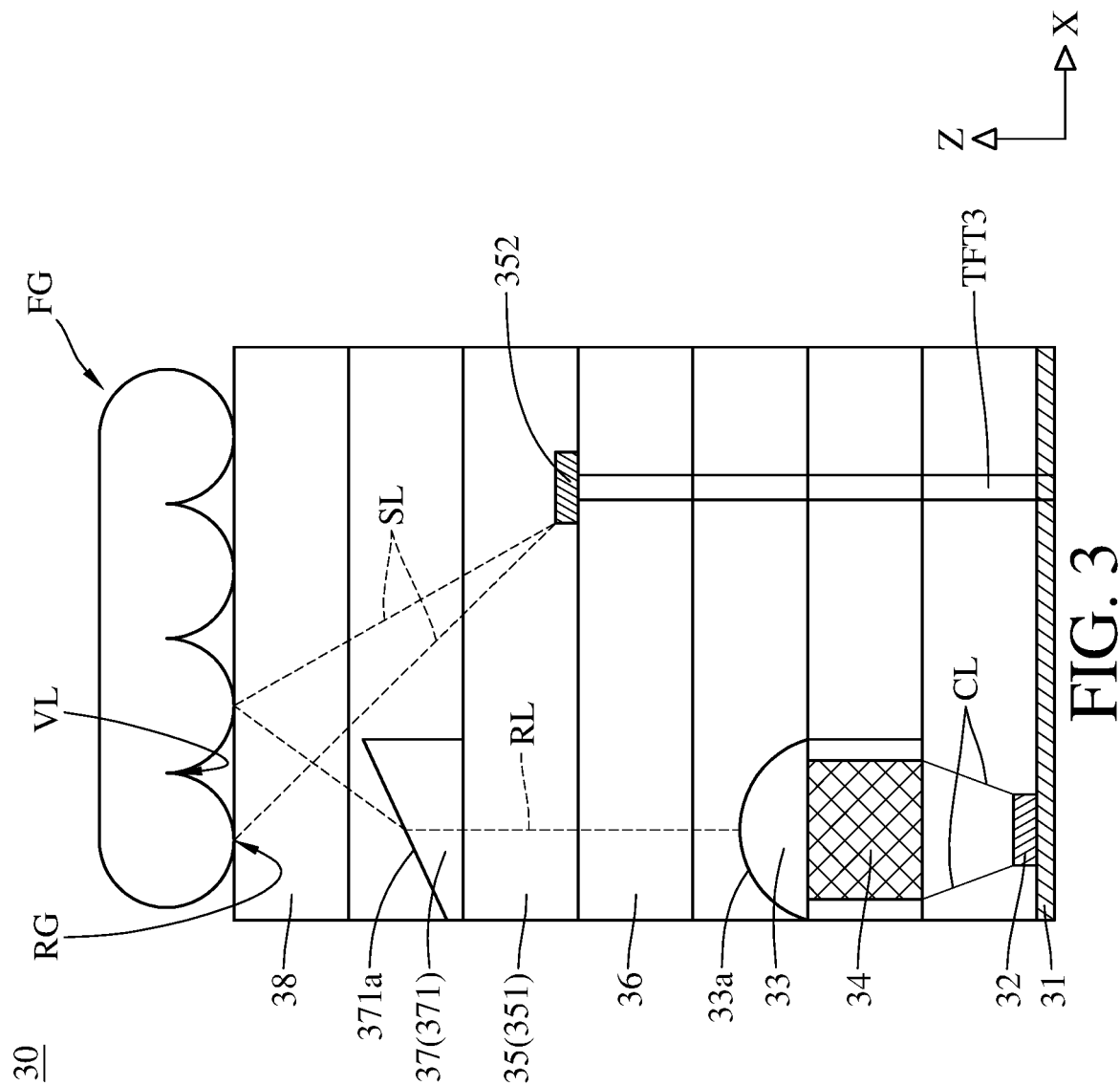
FIG. 3 is a schematic view of an optical fingerprint identification system according to the 3rd embodiment of the present disclosure.

Please refer to FIG. 3, which is a schematic view of an optical fingerprint identification system according to the 3rd embodiment of the present disclosure. In this embodiment, the optical fingerprint identification system 30 includes a base 31, a photo sensor 32, a condenser medium layer 34, a condenser lens element 33, a touch layer 36, a light emitting layer 35, a light path adjusting element 37 and a cover 38. The photo sensor 32 is disposed on the base 31 in a stack direction Z. The condenser lens element 33 is disposed above the photo sensor 32 in the stack direction Z. The condenser medium layer 34 is disposed above the photo sensor 32 and below the condenser lens element 33 in the stack direction Z. The light emitting layer 35 is disposed above the photo sensor 32 and the condenser lens element 33 in the stack direction Z. The touch layer 36 is disposed above the condenser lens element 33 and below the light emitting layer 35 in the stack direction Z. The light path adjusting element 37 is disposed above the photo sensor 32, the condenser lens element 33, the touch layer 36 and the light emitting layer 35 in the stack direction Z, such that the touch layer 36 is located between the photo sensor 32 and the light path adjusting element 37. The cover 38 is disposed above the light emitting layer 35 and the light path adjusting element 37 in the stack direction Z.

Specifically, the condenser lens element 33 is located above the photo sensor 32 and below the light path adjusting element 37. The condenser lens element 33 has a convex lens surface 33a facing the light path adjusting element 37 in the stack direction Z.

There is a reinforcement structure (not numbered) located outside the condenser medium layer 34, and the reinforcement structure is able to keep the condenser medium layer 34 fixed in place. When a refractive index of the condenser medium layer 34 is nA, the following condition is satisfied: nA=1.62; nA=1.77; or nA=2.01.

The light emitting layer 35 includes a display unit 351, and the display unit 351 includes a light emitting element 352. The light emitting element 352 is disposed away from the photo sensor 32, the condenser lens element 33 and the light path adjusting element 37 in a sideway direction that is different from the stack direction Z. Specifically, the light emitting element 352 is disposed away from the photo sensor 32, the condenser lens element 33 and the light path adjusting element 37 in a first direction X that is the same as the sideway direction.

The light emitting element 352 comprises an organic light emitting diode and thus can be used as a light source to emit red light or green light. The light emitting element 352 and the base 31 are connected via a thin-film-transistor circuitry structure TFT3, and the light emitting element 352 and the photo sensor 32 are indirectly connected via the thin-film-transistor circuitry structure TFT3 and the base 31.

The light path adjusting element 37 is located between the photo sensor 32 and the cover 38. The light path adjusting element 37 and the photo sensor 32 are substantially aligned in the stack direction Z. In other words, the light path adjusting element 37 has an orthographic projection on the base 31 overlapping with an orthographic projection of the photo sensor 32 on the base 31. The light path adjusting element 37 includes a wedge prism 371. The wedge prism 371 has an inclined surface 371a facing the cover 38 in the stack direction Z.

When user's finger FG is placed on the cover 38, the light emitting element 352 can emit a sensing light SL towards the finger FG. The finger FG has fingerprint patterns, and the finger FG has a valley portion VL and a ridge portion RG on the surface thereof. The sensing light SL can be reflected off the valley portion VL and the ridge portion RG and then transmitted to the inclined surface 371a of the wedge prism 371 to become a deflected light RL, wherein an angle between the deflected light RL and the normal line (not shown, which is a line parallel to the stack direction Z) of the photo sensor 32 is smaller than an angle between the sensing light SL and the normal line of the photo sensor 32. Then, the deflected light RL is transmitted to the convex lens surface 33a of the condenser lens element 33 and then passes through the condenser medium layer 34 to become a converging light CL towards the photo sensor 32. The converging light CL is imaged on the photo sensor 32 to generate image data, and the image data is transmitted to a processor (not shown). Image data of several optical fingerprint identification systems would be collected to form an image for the processor to perform an identification process.

4th Embodiment

Figure 4A:
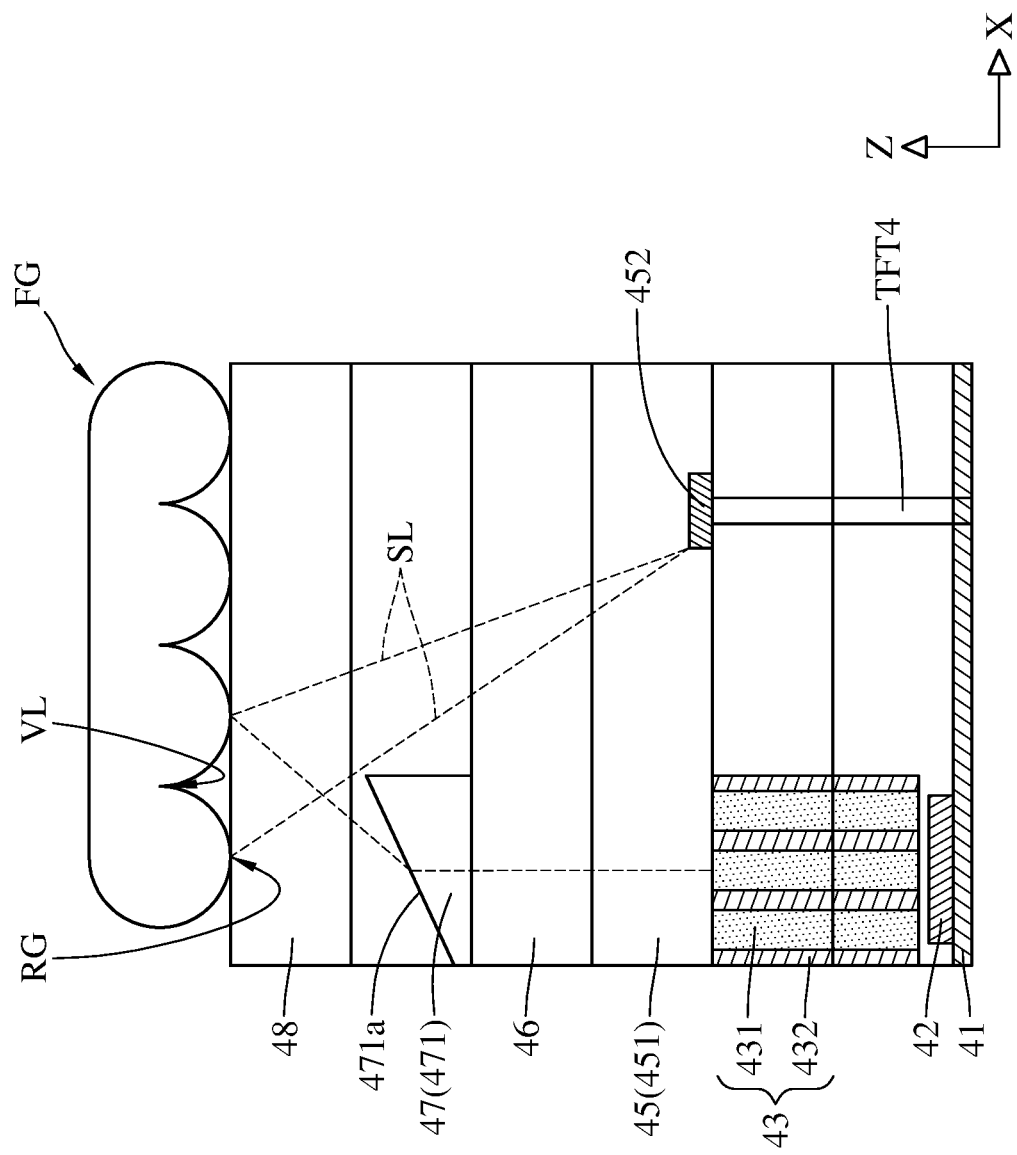
FIG. 4a is a schematic view of an optical fingerprint identification system according to the 4th embodiment of the present disclosure.
Figure 4B:
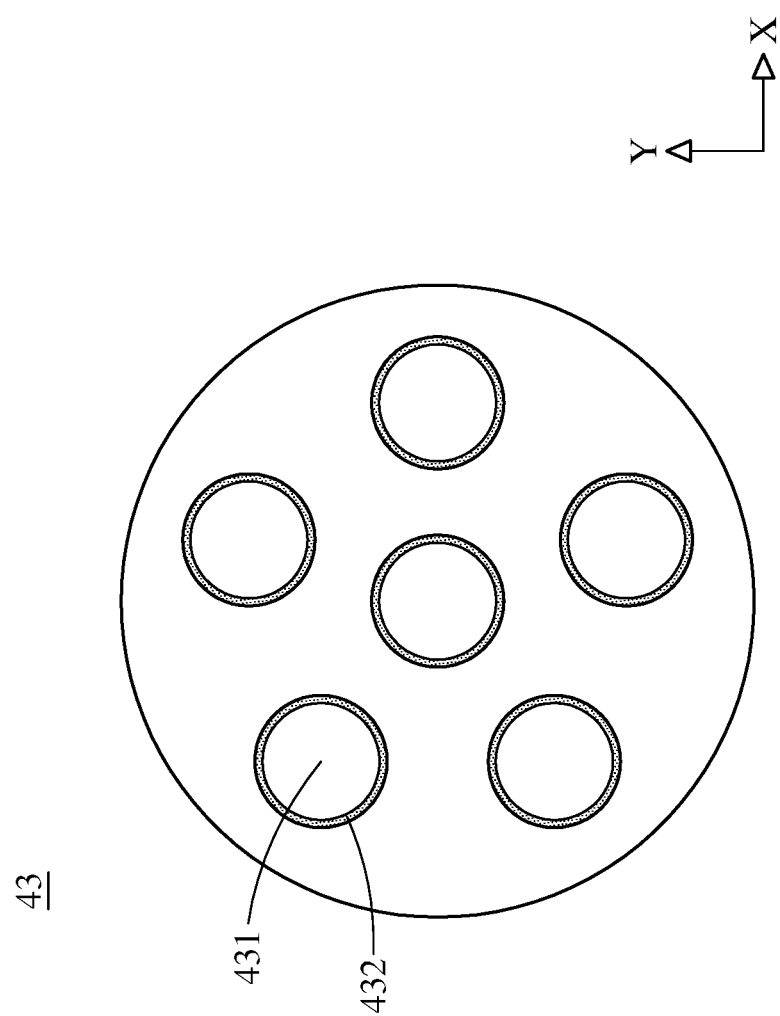

Please refer to FIG. 4a to FIG. 4b, where FIG. 4a is a schematic view of an optical fingerprint identification system according to the 4th embodiment of the present disclosure, and FIG. 4b is a top view of a collimator unit of the optical fingerprint identification system of FIG. 4a. In this embodiment, the optical fingerprint identification system 40 includes a base 41, a photo sensor 42, a collimator unit 43, a light emitting layer 45, a touch layer 46, a light path adjusting element 47 and a cover 48. The photo sensor 42 is disposed on the base 41 in a stack direction Z. The collimator unit 43 is disposed above the photo sensor 42 in the stack direction Z. The light emitting layer 45 is disposed above the photo sensor 42 and the collimator unit 43 in the stack direction Z. The touch layer 46 is disposed above the light emitting layer 45 in the stack direction Z. The light path adjusting element 47 is disposed above the photo sensor 42, the collimator unit 43, the light emitting layer 45 and the touch layer 46 in the stack direction Z, such that the touch layer 46 is located between the photo sensor 42 and the light path adjusting element 47. The cover 48 is disposed above the light emitting layer 45 and the light path adjusting element 47 in the stack direction Z.

Specifically, the collimator unit 43 is located above the photo sensor 42 and below the light path adjusting element 47. Please refer to FIG. 4b, in which the collimator unit 43 is viewed in the stack direction Z. As shown in FIG. 4b, the collimator unit 43 has a plurality of tubular holes 431 and a reflective layer 432. The reflective layers 432 is disposed on each inner wall of the collimator unit 43 to surround the tubular holes 431 by taking lines that are parallel to the stack direction Z and pass through the geometric centers of the tubular holes 431 as axes.

The light emitting layer 45 includes a display unit 451, and the display unit 451 includes a light emitting element 452. The light emitting element 452 is disposed away from the photo sensor 42, the collimator unit 43 and the light path adjusting element 47 in a sideway direction that is different from the stack direction Z. Specifically, the light emitting element 452 is disposed away from the photo sensor 42, the collimator unit 43 and the light path adjusting element 47 in a first direction X that is the same as the sideway direction.

The light emitting element 452 comprises an organic light emitting diode and thus can be used as a light source to emit red light or green light. The light emitting element 452 and the base 41 are connected via a thin-film-transistor circuitry structure TFT4, and the light emitting element 452 and the photo sensor 42 are indirectly connected via the thin-film-transistor circuitry structure TFT4 and the base 41.

The light path adjusting element 47 is located between the photo sensor 42 and the cover 48. The light path adjusting element 47 and the photo sensor 42 are substantially aligned in the stack direction Z. In other words, the light path adjusting element 47 has an orthographic projection on the base 41 overlapping with an orthographic projection of the photo sensor 42 on the base 41. The light path adjusting element 47 includes a wedge prism 471. The wedge prism 471 has an inclined surface 471a facing the cover 48 in the stack direction Z.

When user's finger FG is placed on the cover 48, the light emitting element 452 can emit a sensing light SL towards the finger FG. The finger FG has fingerprint patterns, and the finger FG has a valley portion VL and a ridge portion RG on the surface thereof. The sensing light SL can be reflected off the valley portion VL and the ridge portion RG and then transmitted to the inclined surface 471a of the wedge prism 471 to become a deflected light RL, wherein an angle between the deflected light RL and the normal line (not shown, which is a line parallel to the stack direction Z) of the photo sensor 42 is smaller than an angle between the sensing light SL and the normal line of the photo sensor 42. Then, the deflected light RL is transmitted to the collimator unit 43 and then reflected off the light reflection layer 432 on the inner walls of the collimator unit 43 to become a light with an incident angle closer to normal imaged on the photo sensor 42 to generate image data. The image data is transmitted to a processor (not shown). Image data of several optical fingerprint identification systems would be collected to form an image for the processor to perform an identification process.

5th Embodiment

Figure 5:
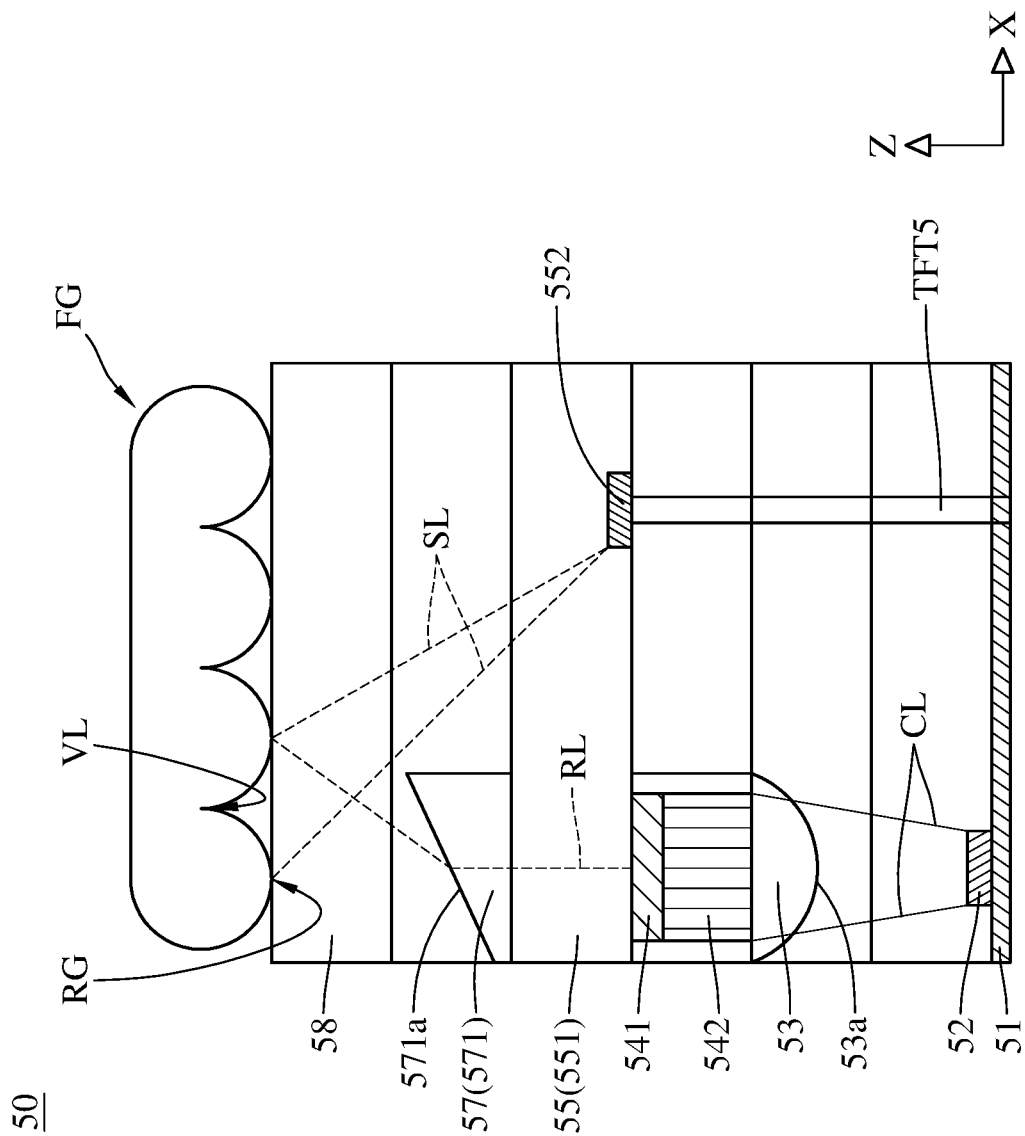
FIG. 5 is a schematic view of an optical fingerprint identification system according to the 5th embodiment of the present disclosure.

Please refer to FIG. 5, which is a schematic view of an optical fingerprint identification system according to the 5th embodiment of the present disclosure. In this embodiment, the optical fingerprint identification system 50 includes a base 51, a photo sensor 52, a condenser lens element 53, a light interference filter layer 541, a light absorption filter layer 542, a light emitting layer 55, a light path adjusting element 57 and a cover 58. The photo sensor 52 is disposed on the base 51 in a stack direction Z. The condenser lens element 53 is disposed above the photo sensor 52 in the stack direction Z. The light interference filter layer 541 and the light absorption filter layer 542 are disposed above the photo sensor 52 and the condenser lens element 53. The light emitting layer 55 is disposed above the photo sensor 52, the condenser lens element 53, the light interference filter layer 541 and the light absorption filter layer 542 in the stack direction Z. The light path adjusting element 57 is disposed above the photo sensor 52, the condenser lens element 53 and the light emitting layer 55 in the stack direction Z. The cover 58 is disposed above the light emitting layer 55 and the light path adjusting element 57 in the stack direction Z.

Specifically, the condenser lens element 53 is located above the photo sensor 52 and below the light path adjusting element 57. The condenser lens element 53 has a convex lens surface 53a facing the photo sensor 52 in the stack direction Z.

The light interference filter layer 541 and the light absorption filter layer 542 are disposed above the photo sensor 52 and below the light path adjusting element 57, and the light absorption filter layer 542 is located between the light interference filter layer 541 and the condenser lens element 53. There is a reinforcement structure (not numbered) located outside the light interference filter layer 541 and the light absorption filter layer 542, and the reinforcement structure is able to keep the light interference filter layer 541 and the light absorption filter layer 542 fixed in place. The light absorption filter layer 542 is a light passable filter layer, and the light absorption filter layer 542 has a light passable bandwidth ranging between visible and near-infrared spectrum.

When a full width at half maximum of a bandwidth of light passing through the light interference filter layer 541 and the light absorption filter layer 542 is FWHM, the following condition is satisfied: FWHM=10 [nm]; or FWHM=40 [nm].

The light emitting layer 55 includes a display unit 551, and the display unit 551 includes a light emitting element 552. The light emitting element 552 is disposed away from the photo sensor 52, the condenser lens element 53 and the light path adjusting element 57 in a sideway direction that is different from the stack direction Z. Specifically, the light emitting element 552 is disposed away from the photo sensor 52, the condenser lens element 53 and the light path adjusting element 57 in a first direction X that is the same as the sideway direction.

The light emitting element 552 comprises an organic light emitting diode and thus can be used as a light source to emit red light or green light. The light emitting element 552 and the base 51 are connected via a thin-film-transistor circuitry structure TFT5, and the light emitting element 552 and the photo sensor 52 are indirectly connected via the thin-film-transistor circuitry structure TFT5 and the base 51.

The light path adjusting element 57 is located between the photo sensor 52 and the cover 58. The light path adjusting element 57 and the photo sensor 52 are substantially aligned in the stack direction Z. In other words, the light path adjusting element 57 has an orthographic projection on the base 51 overlapping with an orthographic projection of the photo sensor 52 on the base 51. The light path adjusting element 57 includes a wedge prism 571. The wedge prism 571 has an inclined surface 571a facing the cover 58 in the stack direction Z.

When user's finger FG is placed on the cover 58, the light emitting element 552 can emit a sensing light SL towards the finger FG. The finger FG has fingerprint patterns, and the finger FG has a valley portion VL and a ridge portion RG on the surface thereof. The sensing light SL can be reflected off the valley portion VL and the ridge portion RG and then transmitted to the inclined surface 571a of the wedge prism 571 to become a deflected light RL, wherein an angle between the deflected light RL and the normal line (not shown, which is a line parallel to the stack direction Z) of the photo sensor 52 is smaller than an angle between the sensing light SL and the normal line of the photo sensor 52. Then, the deflected light RL is transmitted to sequentially pass the light interference filter layer 541, the light absorption filter layer 542 and the convex lens surface 53a of the condenser lens element 53 to become a converging light CL towards the photo sensor 52. The converging light CL is imaged on the photo sensor 52 to generate image data, and the image data is transmitted to a processor (not shown). Image data of several optical fingerprint identification systems would be collected to form an image for the processor to perform an identification process.

6th Embodiment

Figure 6:
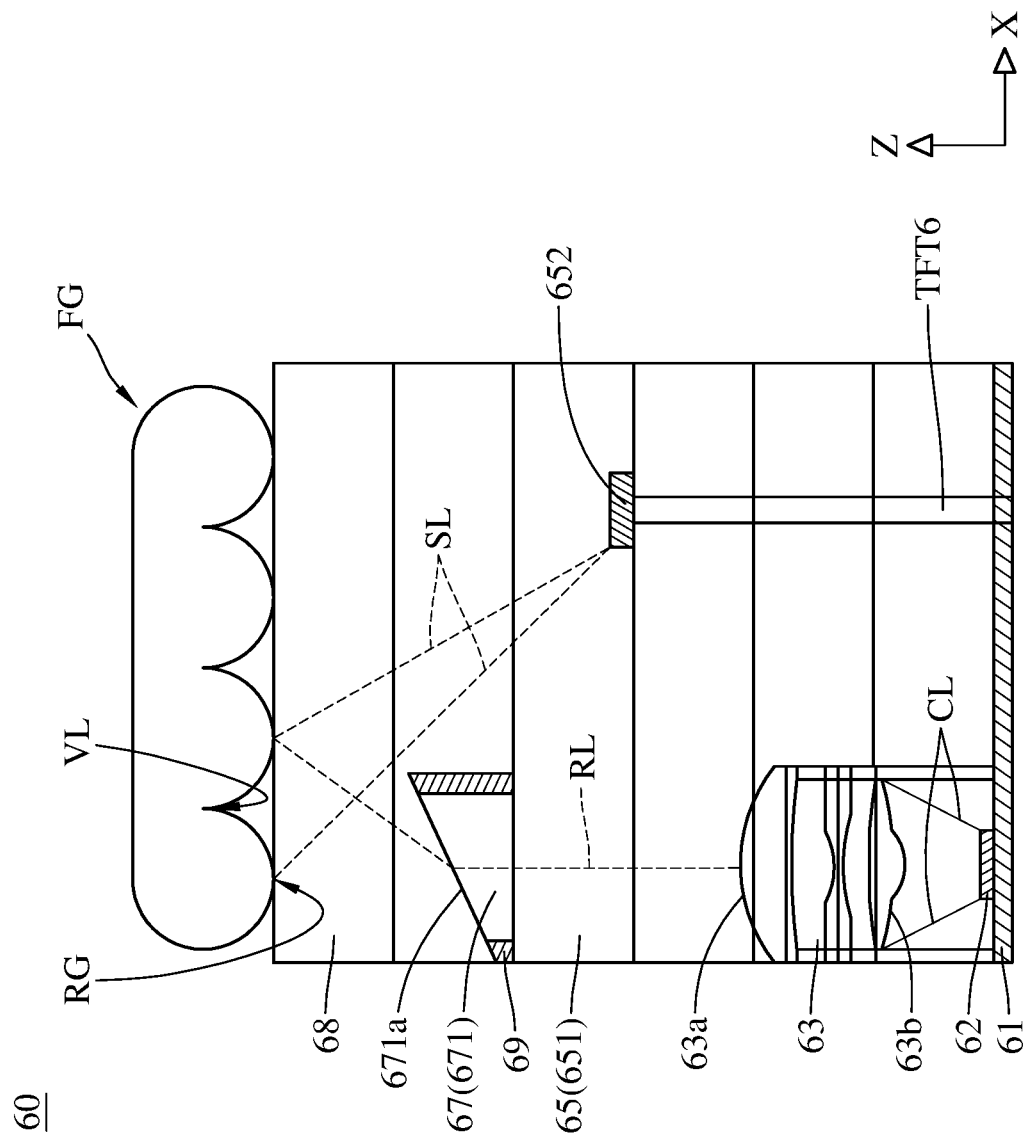
FIG. 6 is a schematic view of an optical fingerprint identification system according to the 6th embodiment of the present disclosure.

Please refer to FIG. 6, which is a schematic view of an optical fingerprint identification system according to the 6th embodiment of the present disclosure. In this embodiment, the optical fingerprint identification system 60 includes a base 61, a photo sensor 62, a wafer level lens assembly 63, a light emitting layer 65, a light path adjusting element 67 and a cover 68. The photo sensor 62 is disposed on the base 61 in a stack direction Z. The wafer level lens assembly 63 is disposed above the photo sensor 62 in the stack direction Z. The light emitting layer 65 is disposed above the photo sensor 62 and the wafer level lens assembly 63 in the stack direction Z. The light path adjusting element 67 is disposed above the photo sensor 62, the wafer level lens assembly 63 and the light emitting layer 65 in the stack direction Z. The cover 68 is disposed above the light emitting layer 65 and the light path adjusting element 67 in the stack direction Z.

Specifically, the wafer level lens assembly 63 is located above the photo sensor 62 and below the light path adjusting element 67. The wafer level lens assembly 63 includes a plurality of wafer level lens elements (not numbered). The plurality of wafer level lens elements have an object-side surface 63a facing the light path adjusting element 67 and an image-side surface 63b facing the photo sensor 62.

The light emitting layer 65 includes a display unit 651, and the display unit 651 includes a light emitting element 652. The light emitting element 652 is disposed away from the photo sensor 62, the wafer level lens assembly 63 and the light path adjusting element 67 in a sideway direction that is different from the stack direction Z. Specifically, the light emitting element 652 is disposed away from the photo sensor 62, the wafer level lens assembly 63 and the light path adjusting element 67 in a first direction X that is the same as the sideway direction.

The light emitting element 652 comprises an organic light emitting diode and thus can be used as a light source to emit red light or green light. The light emitting element 652 and the base 61 are connected via a thin-film-transistor circuitry structure TFT6, and the light emitting element 652 and the photo sensor 62 are indirectly connected via the thin-film-transistor circuitry structure TFT6 and the base 61.

The light path adjusting element 67 is located between the photo sensor 62 and the cover 68. The light path adjusting element 67 and the photo sensor 62 are substantially aligned in the stack direction Z. In other words, the light path adjusting element 67 has an orthographic projection on the base 61 overlapping with an orthographic projection of the photo sensor 62 on the base 61. The light path adjusting element 67 includes a wedge prism 671. The wedge prism 671 has an inclined surface 671a facing the cover 68 in the stack direction Z.

The optical fingerprint identification system 60 further includes a light absorption layer 69. The light absorption layer 69 surrounds an outer rim of the light path adjusting element 67 by taking a line that is parallel to the stack direction Z and passes through the wedge prism 671 as an axis.

When user's finger FG is placed on the cover 68, the light emitting element 652 can emit a sensing light SL towards the finger FG. The finger FG has fingerprint patterns, and the finger FG has a valley portion VL and a ridge portion RG on the surface thereof. The sensing light SL can be reflected off the valley portion VL and the ridge portion RG and then transmitted to the inclined surface 671a of the wedge prism 671 to become a deflected light RL, wherein an angle between the deflected light RL and the normal line (not shown, which is a line parallel to the stack direction Z) of the photo sensor 62 is smaller than an angle between the sensing light SL and the normal line of the photo sensor 62. Then, the deflected light RL is transmitted to the object-side surface 63a and the image-side surface 63b of the wafer level lens assembly 63 to become a converging light CL towards the photo sensor 62. The converging light CL is imaged on the photo sensor 62 to generate image data, and the image data is transmitted to a processor (not shown). Image data of several optical fingerprint identification systems would be collected to form an image for the processor to perform an identification process.

7th Embodiment

Figure 7:
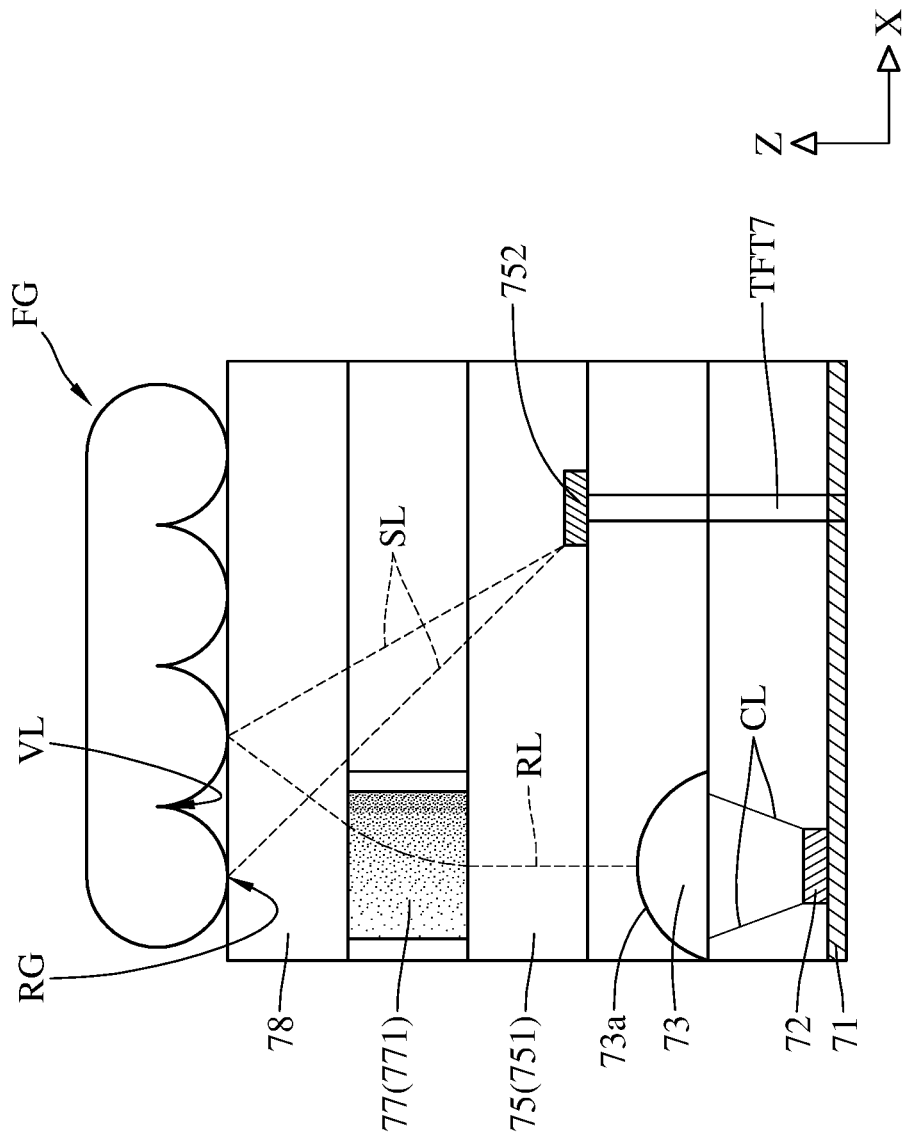
FIG. 7 is a schematic view of an optical fingerprint identification system according to the 7th embodiment of the present disclosure.

Please refer to FIG. 7, which is a schematic view of an optical fingerprint identification system according to the 7th embodiment of the present disclosure. In this embodiment, the optical fingerprint identification system 70 includes a base 71, a photo sensor 72, a condenser lens element 73, a light emitting layer 75, a light path adjusting element 77 and a cover 78. The photo sensor 72 is disposed on the base 71 in a stack direction Z. The condenser lens element 73 is disposed above the photo sensor 72 in the stack direction Z. The light emitting layer 75 is disposed above the photo sensor 72 and the condenser lens element 73 in the stack direction Z. The light path adjusting element 77 is disposed above the photo sensor 72, the condenser lens element 73 and the light emitting layer 75 in the stack direction Z. The cover 78 is disposed above the light emitting layer 75 and the light path adjusting element 77 in the stack direction Z.

Specifically, the condenser lens element 73 is located above the photo sensor 72 and below the light path adjusting element 77. The condenser lens element 73 has a convex lens surface 73a facing the light path adjusting element 77 in the stack direction Z.

The light emitting layer 75 includes a display unit 751, and the display unit 751 includes a light emitting element 752. The light emitting element 752 is disposed away from the photo sensor 72, the condenser lens element 73 and the light path adjusting element 77 in a sideway direction that is different from the stack direction Z. Specifically, the light emitting element 752 is disposed away from the photo sensor 72, the condenser lens element 73 and the light path adjusting element 77 in a first direction X that is the same as the sideway direction.

The light emitting element 752 comprises an organic light emitting diode and thus can be used as a light source to emit red light or green light. The light emitting element 752 and the base 71 are connected via a thin-film-transistor circuitry structure TFT7, and the light emitting element 752 and the photo sensor 72 are indirectly connected via the thin-film-transistor circuitry structure TFT7 and the base 71.

The light path adjusting element 77 is located between the photo sensor 72 and the cover 78. The light path adjusting element 77 and the photo sensor 72 are substantially aligned in the stack direction Z. In other words, the light path adjusting element 77 has an orthographic projection on the base 71 overlapping with an orthographic projection of the photo sensor 72 on the base 71. The light path adjusting element 77 includes a gradient refractive index element 771. There is a reinforcement structure (not numbered) located outside the gradient refractive index element 771, and the reinforcement structure is able to keep the gradient refractive index element 771 fixed in place. A refractive index of the gradient refractive index element 771 gradually decreases in a direction away from the light emitting element 752 (e.g., the opposite direction of the first direction X). Please refer to the gradient refractive index element 771 in FIG. 7, the density of the dots corresponds to the value of the refractive index of the gradient refractive index element 771. The denser the dots are illustrated, the larger the refractive index of the gradient refractive index element 771 is; while the sparser the dots are illustrated, the smaller the refractive index of the gradient refractive index element 771 is.

When a maximum refractive index of the gradient refractive index element 771 is Nmax, and a minimum refractive index of the gradient refractive index element 771 is Nmin, the following condition is satisfied: Nmax/Nmin=1.5; Nmax/Nmin=2; or Nmax/Nmin=4.

When user's finger FG is placed on the cover 78, the light emitting element 752 can emit a sensing light SL towards the finger FG. The finger FG has fingerprint patterns, and the finger FG has a valley portion VL and a ridge portion RG on the surface thereof. The sensing light SL can be reflected off the valley portion VL and the ridge portion RG and then gradually deflected to become a deflected light RL while passing through the gradient refractive index element 771, wherein an angle between the deflected light RL and the normal line (not shown, which is a line parallel to the stack direction Z) of the photo sensor 72 is smaller than an angle between the sensing light SL and the normal line of the photo sensor 72. Then, the deflected light RL is transmitted to the convex lens surface 73a of the condenser lens element 73 to become a converging light CL towards the photo sensor 72. The converging light CL is imaged on the photo sensor 72 to generate image data, and the image data is transmitted to a processor (not shown). Image data of several optical fingerprint identification systems would be collected to form an image for the processor to perform an identification process.

8th Embodiment

Figure 8:
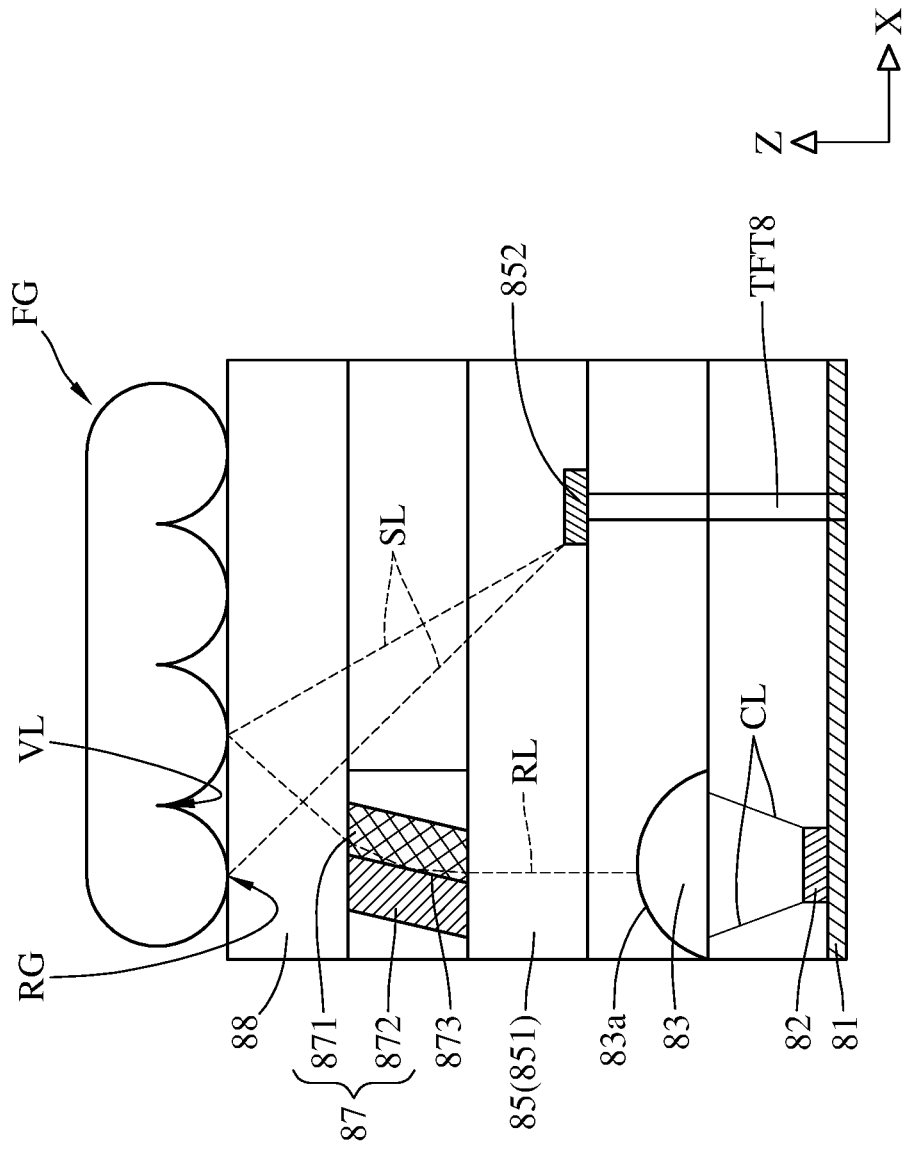
FIG. 8 is a schematic view of an optical fingerprint identification system according to the 8th embodiment of the present disclosure.

Please refer to FIG. 8, which is a schematic view of an optical fingerprint identification system according to the 8th embodiment of the present disclosure. In this embodiment, the optical fingerprint identification system 80 includes a base 81, a photo sensor 82, a condenser lens element 83, a light emitting layer 85, a light path adjusting element 87 and a cover 88. The photo sensor 82 is disposed on the base 81 in a stack direction Z. The condenser lens element 83 is disposed above the photo sensor 82 in the stack direction Z. The light emitting layer 85 is disposed above the photo sensor 82 and the condenser lens element 83 in the stack direction Z. The light path adjusting element 87 is disposed above the photo sensor 82, the condenser lens element 83 and the light emitting layer 85 in the stack direction Z. The cover 88 is disposed above the light emitting layer 85 and the light path adjusting element 87 in the stack direction Z.

Specifically, the condenser lens element 83 is located above the photo sensor 82 and below the light path adjusting element 87. The condenser lens element 83 has a convex lens surface 83a facing the light path adjusting element 87 in the stack direction Z.

The light emitting layer 85 includes a display unit 851, and the display unit 851 includes a light emitting element 852. The light emitting element 852 is disposed away from the photo sensor 82, the condenser lens element 83 and the light path adjusting element 87 in a sideway direction that is different from the stack direction Z. Specifically, the light emitting element 852 is disposed away from the photo sensor 82, the condenser lens element 83 and the light path adjusting element 87 in a first direction X that is the same as the sideway direction.

The light emitting element 852 comprises an organic light emitting diode and thus can be used as a light source to emit red light or green light. The light emitting element 852 and the base 81 are connected via a thin-film-transistor circuitry structure TFT8, and the light emitting element 852 and the photo sensor 82 are indirectly connected via the thin-film-transistor circuitry structure TFT8 and the base 81.

The light path adjusting element 87 is located between the photo sensor 82 and the cover 88. The light path adjusting element 87 and the photo sensor 82 are substantially aligned in the stack direction Z. In other words, the light path adjusting element 87 has an orthographic projection on the base 81 overlapping with an orthographic projection of the photo sensor 82 on the base 81. The light path adjusting element 87 includes at least two medium layers. Specifically, the light path adjusting element 87 includes a first medium layer 871 and a second medium layer 872 that are adjacent to each other. There is a reinforcement structure (not numbered) located outside the first medium layer 871 and the second medium layer 872, and the reinforcement structure is able to keep the first medium layer 871 and the second medium layer 872 fixed in place. There is an inclined surface 873 connected to and located between the first medium layer 871 and the second medium layer 872, and the inclined surface 873 is sloping to the stack direction Z. The second medium layer 872 that is disposed further away from the light emitting element 852 than the first medium layer 871 has a lower refractive index than that of the first medium layer 871, and the inclined surface 873 connected therebetween forms a total reflection surface.

When user's finger FG is placed on the cover 88, the light emitting element 852 can emit a sensing light SL towards the finger FG. The finger FG has fingerprint patterns, and the finger FG has a valley portion VL and a ridge portion RG on the surface thereof. The sensing light SL can be reflected off the valley portion VL and the ridge portion RG and then totally reflected to become a deflected light RL after passing through the first medium layer 871, wherein an angle between the deflected light RL and the normal line (not shown, which is a line parallel to the stack direction Z) of the photo sensor 82 is smaller than an angle between the sensing light SL and the normal line of the photo sensor 82. Then, the deflected light RL is transmitted to the convex lens surface 83a of the condenser lens element 83 to become a converging light CL towards the photo sensor 82. The converging light CL is imaged on the photo sensor 82 to generate image data, and the image data is transmitted to a processor (not shown). Image data of several optical fingerprint identification systems would be collected to form an image for the processor to perform an identification process.

9th Embodiment

Figure 9:
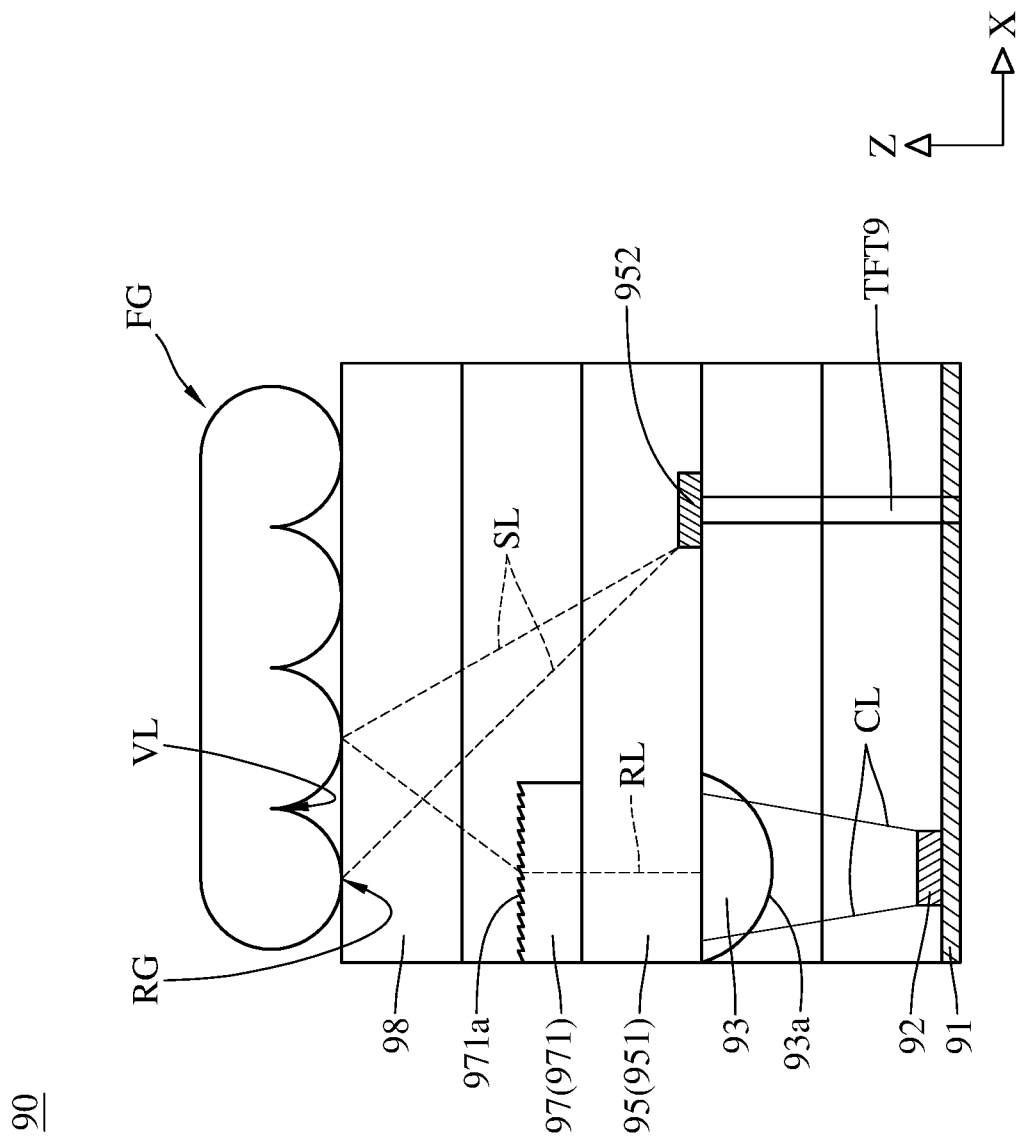
FIG. 9 is a schematic view of an optical fingerprint identification system according to the 9th embodiment of the present disclosure.

Please refer to FIG. 9, which is a schematic view of an optical fingerprint identification system according to the 9th embodiment of the present disclosure. In this embodiment, the optical fingerprint identification system 90 includes a base 91, a photo sensor 92, a condenser lens element 93, a light emitting layer 95, a light path adjusting element 97 and a cover 98. The photo sensor 92 is disposed on the base 91 in a stack direction Z. The condenser lens element 93 is disposed above the photo sensor 92 in the stack direction Z. The light emitting layer 95 is disposed above the photo sensor 92 and the condenser lens element 93 in the stack direction Z. The light path adjusting element 97 is disposed above the photo sensor 92, the condenser lens element 93 and the light emitting layer 95 in the stack direction Z. The cover 98 is disposed above the light emitting layer 95 and the light path adjusting element 97 in the stack direction Z.

Specifically, the condenser lens element 93 is located above the photo sensor 92 and below the light path adjusting element 97. The condenser lens element 93 has a convex lens surface 93a facing the photo sensor 92 in the stack direction Z.

The light emitting layer 95 includes a display unit 951, and the display unit 951 includes a light emitting element 952. The light emitting element 952 is disposed away from the photo sensor 92, the condenser lens element 93 and the light path adjusting element 97 in a sideway direction that is different from the stack direction Z. Specifically, the light emitting element 952 is disposed away from the photo sensor 92, the condenser lens element 93 and the light path adjusting element 97 in a first direction X that is the same as the sideway direction.

The light emitting element 952 comprises an organic light emitting diode and thus can be used as a light source to emit red light or green light. The light emitting element 952 and the base 91 are connected via a thin-film-transistor circuitry structure TFT9, and the light emitting element 952 and the photo sensor 92 are indirectly connected via the thin-film-transistor circuitry structure TFT9 and the base 91.

The light path adjusting element 97 is located between the photo sensor 92 and the cover 98. The light path adjusting element 97 and the photo sensor 92 are substantially aligned in the stack direction Z. In other words, the light path adjusting element 97 has an orthographic projection on the base 91 overlapping with an orthographic projection of the photo sensor 92 on the base 91. The light path adjusting element 97 includes a Fresnel lens element 971. The Fresnel lens element 971 has a plurality of miniature inclined surfaces 971a in the stack direction Z. Each of the plurality of miniature inclined surfaces 971a faces the cover 98, and the incline direction of each of the plurality of miniature inclined surfaces 971a is substantially the same as the incline direction of each of the inclined surface 171a-671a of the wedge prisms 171-671 in the 1st to the 6th embodiments.

When user's finger FG is placed on the cover 98, the light emitting element 952 can emit a sensing light SL towards the finger FG. The finger FG has fingerprint patterns, and the finger FG has a valley portion VL and a ridge portion RG on the surface thereof. The sensing light SL can be reflected off the valley portion VL and the ridge portion RG and then transmitted to the miniature inclined surfaces 971a of the Fresnel lens element 971 to become a deflected light RL, wherein an angle between the deflected light RL and the normal line (not shown, which is a line parallel to the stack direction Z) of the photo sensor 92 is smaller than an angle between the sensing light SL and the normal line of the photo sensor 92. Then, the deflected light RL is transmitted to the convex lens surface 93a of the condenser lens element 93 to become a converging light CL towards the photo sensor 92. The converging light CL is imaged on the photo sensor 92 to generate image data, and the image data is transmitted to a processor (not shown). Image data of several optical fingerprint identification systems would be collected to form an image for the processor to perform an identification process.

10th Embodiment

Figure 10:
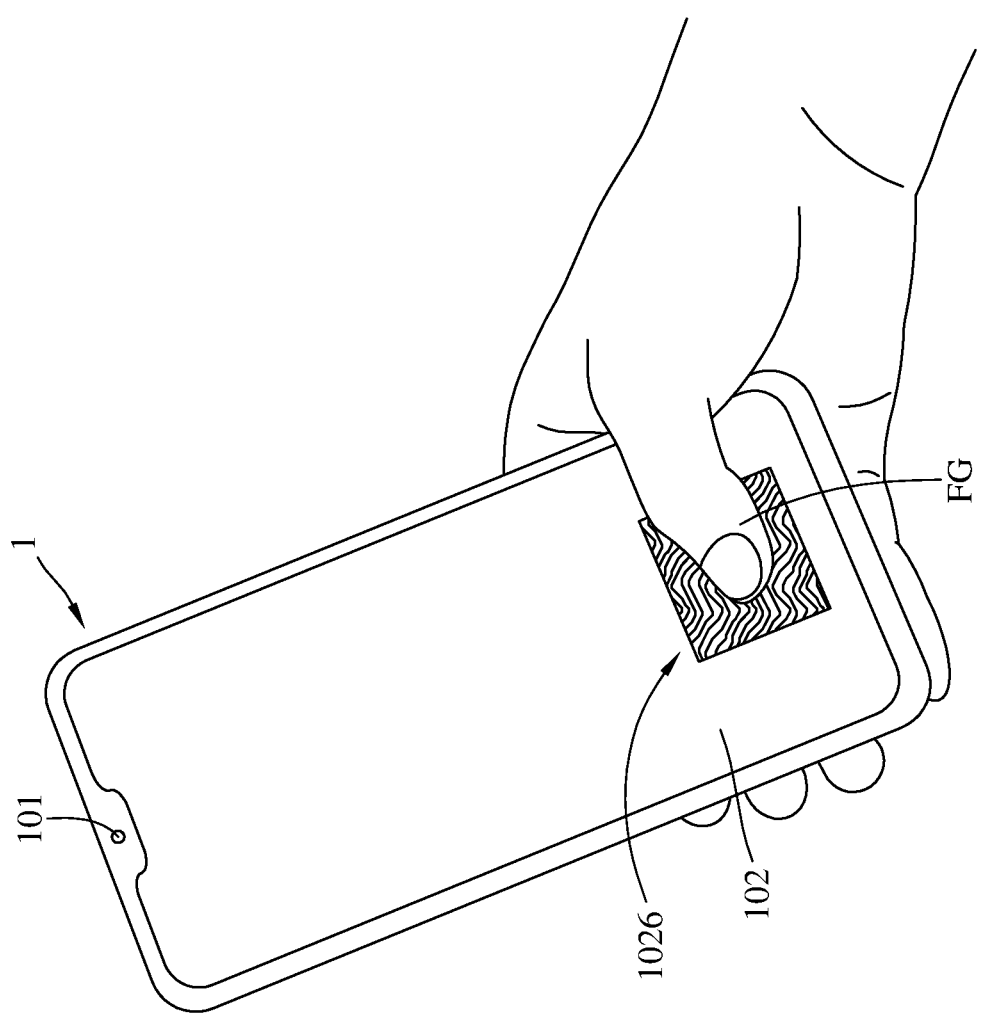
FIG. 10 is a schematic view showing a usage scenario of an optical fingerprint identification device according to the 10th embodiment of the present disclosure.
Figure 11:
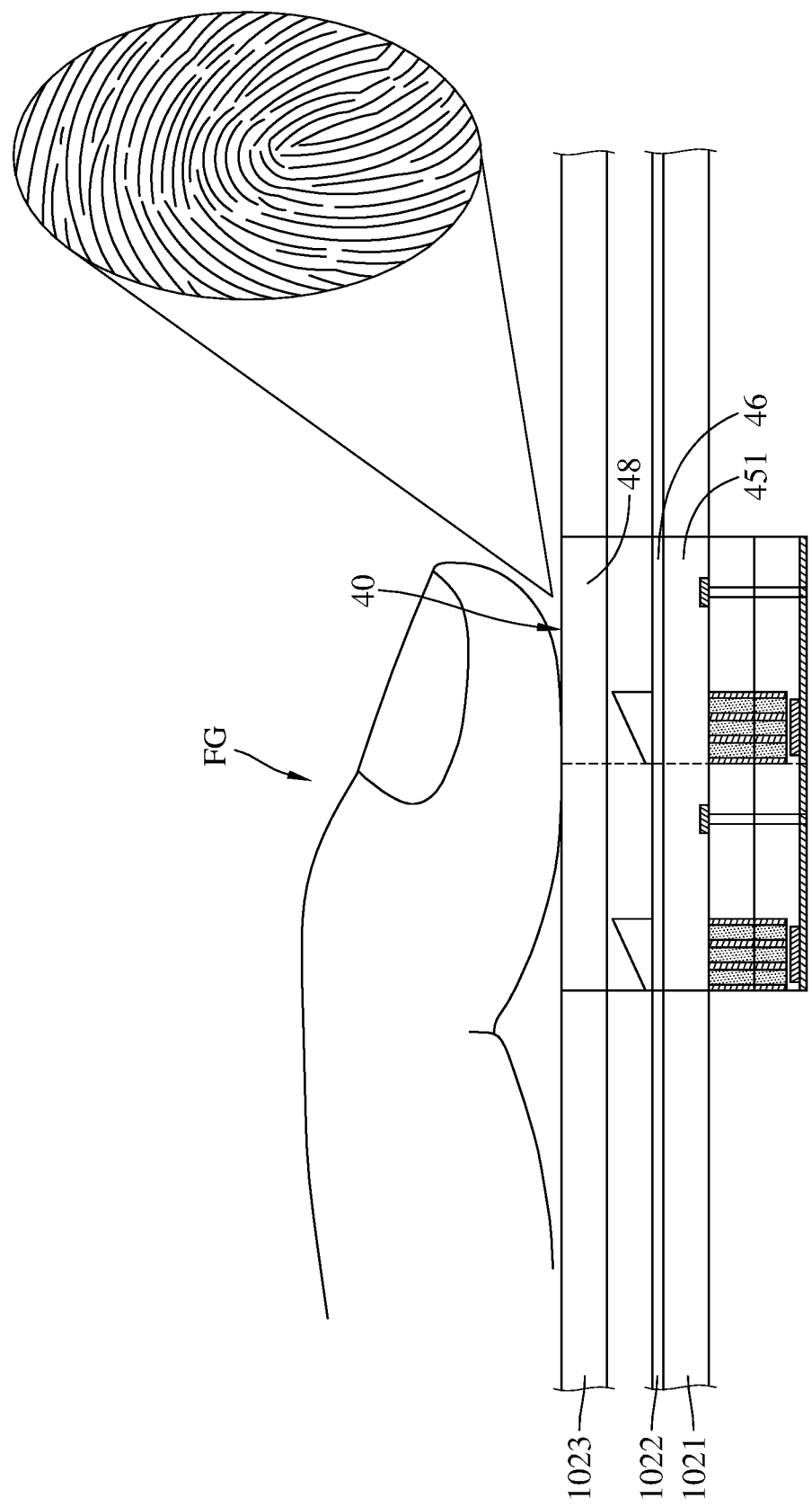
FIG. 11 is a schematic view showing that the optical fingerprint identification device of FIG. 10 is identifying a fingerprint.

Please refer to FIG. 10 and FIG. 11, where FIG. 10 is a schematic view showing a usage scenario of an optical fingerprint identification device according to the 10th embodiment of the present disclosure, and FIG. 11 is a schematic view showing that the optical fingerprint identification device of FIG. 10 is identifying a fingerprint.

In this embodiment, an electronic device 1 is a smart phone having a biometrics identification function. The electronic device 1 includes an image capturing module 101 and a display module 102. The image capturing module 101 is a front-facing camera of the electronic device 1 for taking selfies. The display module 102 includes a screen display layer 1021, a screen touch layer 1022 and a transparent plate 1023. The screen display layer 1021 can display images. Moreover, the screen display layer 1021 can use OLEDs or active-matrix organic light-emitting diodes (AMOLEDs). The screen touch layer 1022 is disposed above the screen display layer 1021. Moreover, the screen touch layer 1022 can have a touch screen function, such that an additional input device can be omitted and the electronic device 1 can be used intuitively. The transparent plate 1023 is disposed above the screen touch layer 1022. Moreover, the transparent plate 1023 can provide a protection function, such that an additional protection component can be omitted. In addition, the display module 102 further includes an optical fingerprint identification device 1026. The optical fingerprint identification device 1026 includes a plurality of optical fingerprint identification systems 40 disclosed in the 4th embodiment. It is noted that only two optical fingerprint identification systems 40 are illustrated in FIG. 11 for schematic purpose, and the optical fingerprint identification systems 40 and the finger FG in FIG. 11 are not in their actual proportion. As described in the 4th embodiment, the optical fingerprint identification system 40 provides a fingerprint identification function; moreover, the display unit 451 included in the optical fingerprint identification system 40 can further provide an image display function, the touch layer 46 included in the optical fingerprint identification system 40 can further provide a touch screen function, and the cover 48 included in the optical fingerprint identification system 40 can further provide a protection function. The optical fingerprint identification device 1026 may alternatively be provided with the optical fingerprint identification system disclosed in other embodiments, and the present disclosure is not limited thereto.

Figure 12:
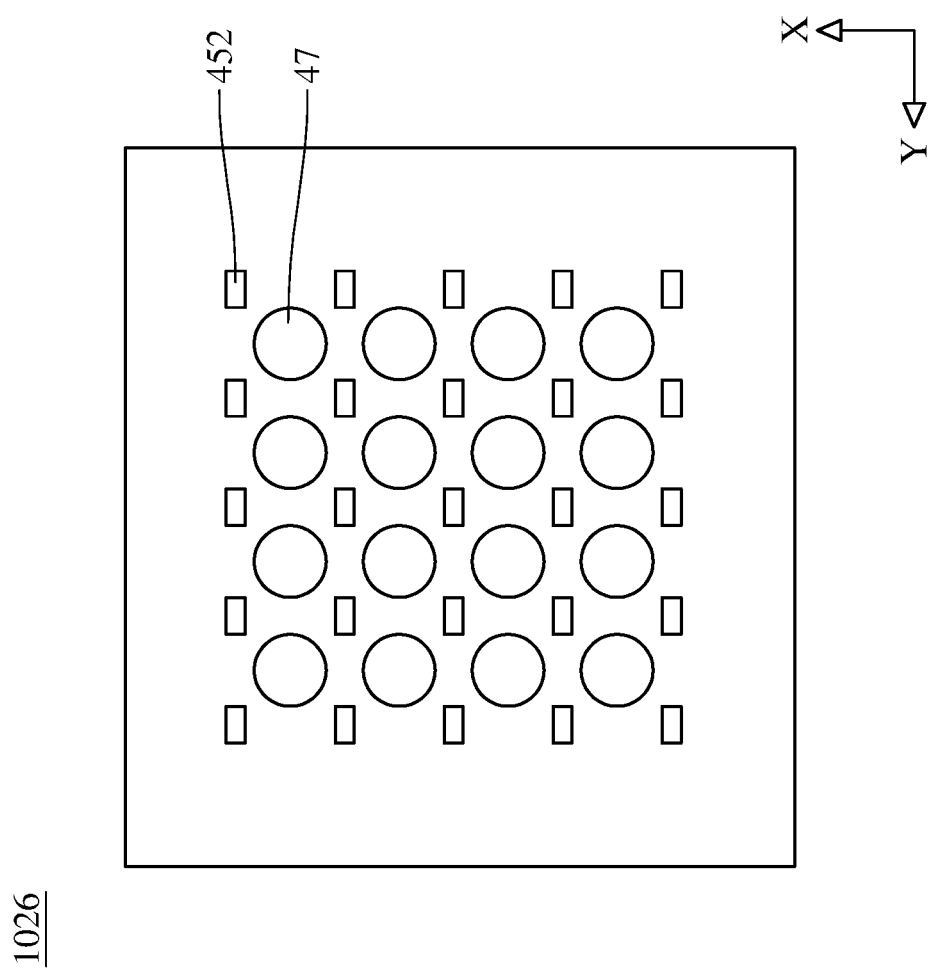
FIG. 12 is a top schematic view showing the configuration of the optical fingerprint identification device of FIG. 10.
Figure 13:
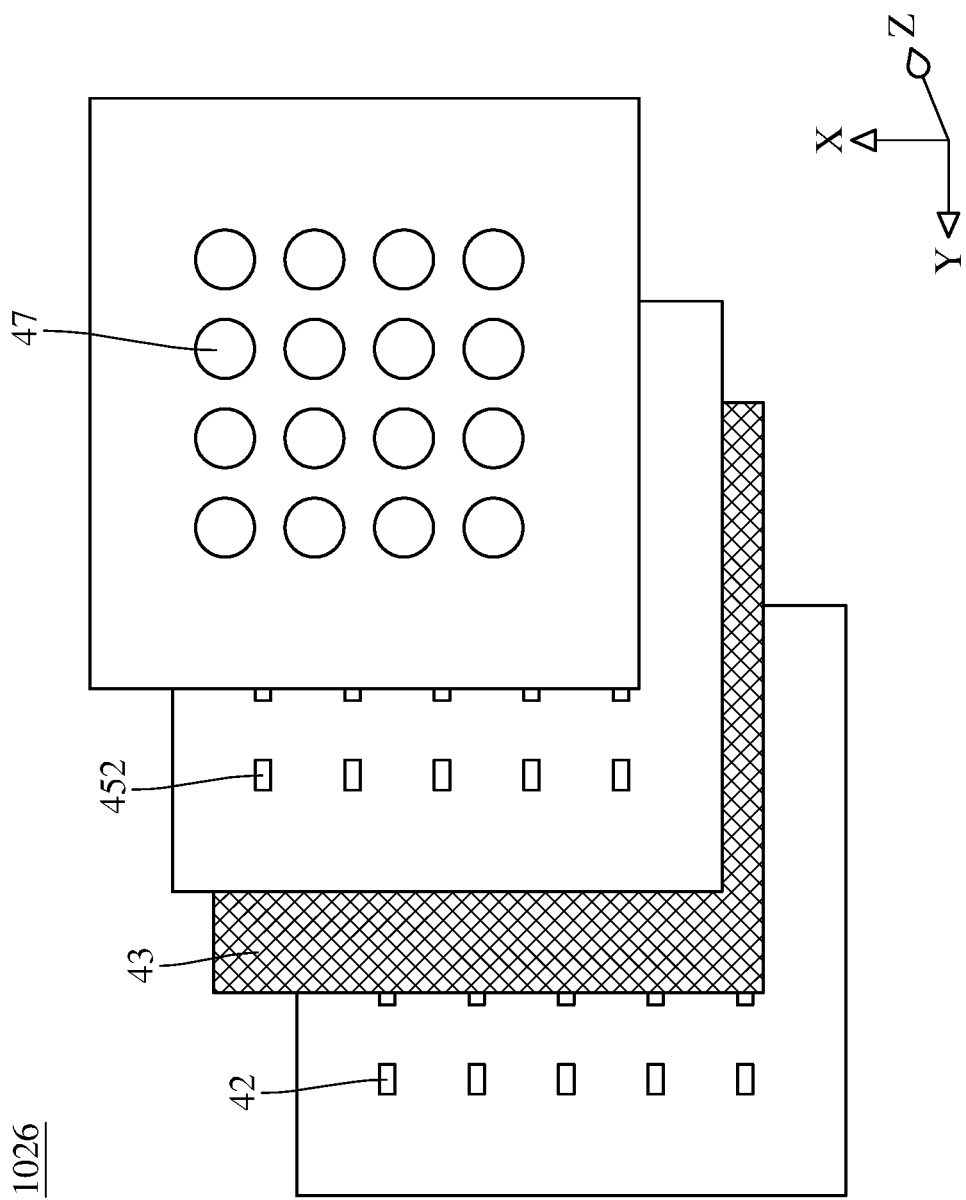
FIG. 13 is an exploded view of the optical fingerprint identification device of FIG. 10.

Please refer to FIG. 12 to FIG. 13, where FIG. 12 is a top schematic view showing the configuration of the optical fingerprint identification device of FIG. 10, and FIG. 13 is an exploded view of the optical fingerprint identification device of FIG. 10.

The optical fingerprint identification device 1026 includes the plurality of light path adjusting elements 47, the plurality of light emitting elements 452, the plurality of collimator units 43 and the plurality of photo sensors 42. As shown in FIG. 13, the light path adjusting elements 47 are located above the light emitting elements 452 in the stack direction Z. As shown in FIG. 12 and FIG. 13, the light path adjusting elements 47 are disposed at equal intervals respectively in the first direction X and the second direction Y, each of the light path adjusting elements 47 is located between adjacent two of the light emitting elements 452 respectively in the first direction X and the second direction Y, and the light path adjusting elements 47 and the light emitting elements 452 are misaligned with each other and alternatively arranged respectively in the first direction X and the second direction Y, wherein the second direction Y is substantially perpendicular to the first direction X and the stack direction Z. The light emitting elements 452 are disposed at equal intervals respectively in the first direction X and a second direction Y. The plurality of collimator units 43 are distributed to the overall layer structure to form a collimator layer (not numbered). The photo sensors 42 are located below the light emitting elements 452 in the stack direction Z, and the photo sensors 42 are disposed at equal intervals in the first direction X. Specifically, each of the photo sensors 42 is located between adjacent two of the light emitting elements 452 in the first direction X. Each of the photo sensors 42 is substantially aligned with each of the light path adjusting elements 47 and each of the collimator units 43 in the stack direction Z so as to receive the imaging light from the light path adjusting element 47 and the collimator unit 43 to be imaged thereon.

In this embodiment, the arrangement of the light path adjusting elements 47 and the light emitting elements 452 shown in FIG. 12 is not intended to restrict the present disclosure.

The smart phone in the present disclosure is only exemplary for showing the optical fingerprint identification systems 10-90 and the optical fingerprint identification devices 1026 of the present disclosure installed in an electronic device for providing the in-display fingerprint identification function, and the present disclosure is not limited thereto. Furthermore, the optical fingerprint identification systems 10-90 and the optical fingerprint identification devices 1026 feature good capability in aberration corrections and high image quality, and can be applied to digital tablets, portable video recorders, multi-camera devices and other electronic imaging devices.

The foregoing description, for the purpose of explanation, has been described with reference to specific embodiments. It is to be noted that the present disclosure shows different data of the different embodiments; however, the data of the different embodiments are obtained from experiments. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the present disclosure to the precise forms disclosed. Many modifications and variations are possible in view of the above teachings.

What is claimed is:

1. An optical fingerprint identification system, comprising:
   a base;
   a photo sensor, disposed on the base;
   a light emitting layer, disposed above the photo sensor, wherein the light emitting layer comprises a light emitting element; and
   a cover, disposed above the light emitting layer;
   wherein the optical fingerprint identification system further comprises a light collecting element between the photo sensor and the light emitting layer and a light path adjusting element between the photo sensor and the cover;
   wherein the optical fingerprint identification system further comprises a light interference filter layer and a light absorption filter layer that are disposed above the photo sensor and below the light path adjusting element, the light interference filter layer is configured to provide a filter bandwidth shift according to a change of an incident light angle thereon, the light absorption filter layer is a light passable filter layer, and the light absorption filter layer has a light passable bandwidth ranging between visible and near-infrared spectrum;
   wherein the light passable bandwidth through the light interference filter layer and the light absorption filter layer includes near-infrared spectral range;
   wherein the light emitting element is disposed away from the light path adjusting element and the photo sensor in a sideway direction that is different from a stack direction of the optical fingerprint identification system;
   wherein the base, the photo sensor, the light collecting element, the light emitting layer, the light path adjusting element and the cover are sequentially disposed along the stack direction of the optical fingerprint identification system;
   wherein the light emitting element and the photo sensor are physically and electrically connected via a thin-film-transistor circuitry structure;
   wherein a full width at half maximum of a bandwidth of light passing through the light interference filter layer and the light absorption filter layer is FWHM, and the following condition is satisfied:
   FWHM<100 [nm].

2. The optical fingerprint identification system of claim 1, wherein the light path adjusting element comprises a wedge prism.

3. The optical fingerprint identification system of claim 2, wherein the light collecting element is a condenser lens element disposed above the photo sensor and below the light path adjusting element.

4. The optical fingerprint identification system of claim 3, further comprising a condenser medium layer disposed below the condenser lens element, wherein a refractive index of the condenser medium layer is nA, and the following condition is satisfied:
   1.60<nA<5.0.

5. The optical fingerprint identification system of claim 2, wherein the light collecting element is a collimator unit disposed above the photo sensor and below the light path adjusting element, and the collimator unit has a plurality of tubular holes.

6. The optical fingerprint identification system of claim 5, wherein the collimator unit comprises a reflective layer disposed on each inner wall of the collimator unit to surround each of the plurality of tubular holes.

7. The optical fingerprint identification system of claim 1, wherein the light path adjusting element comprises a gradient refractive index element.

8. The optical fingerprint identification system of claim 7, wherein a maximum refractive index of the gradient refractive index element is Nmax, a minimum refractive index of the gradient refractive index element is Nmin, and the following condition is satisfied:
   1.2<Nmax/Nmin<4.5.

9. The optical fingerprint identification system of claim 7, wherein a refractive index of the gradient refractive index element decreases in a direction away from the light emitting element.

10. The optical fingerprint identification system of claim 1, wherein the light path adjusting element comprises at least two medium layers, and there is an inclined surface connected to and located between two adjacent layers of the at least two medium layers.

11. The optical fingerprint identification system of claim 10, wherein one of the at least two medium layers disposed further away from the light emitting element than other of the at least two medium layers has a lower refractive index than that of the other of the at least two medium layers.

12. The optical fingerprint identification system of claim 10, wherein the inclined surface is a total reflection surface.

13. The optical fingerprint identification system of claim 1, wherein the light emitting element is disposed away from the light path adjusting element and the photo sensor.

14. The optical fingerprint identification system of claim 1, wherein the light collecting element is a wafer level lens assembly disposed above the photo sensor and below the light path adjusting element.

15. The optical fingerprint identification system of claim 1, wherein the light collecting element is a metalens element disposed above the photo sensor and below the light path adjusting element.

16. The optical fingerprint identification system of claim 1, further comprising a light absorption layer that surrounds an outer rim of the light path adjusting element.

17. The optical fingerprint identification system of claim 1, wherein the light path adjusting element and the photo sensor are substantially aligned with each other in the stack direction of the optical fingerprint identification system.

18. The optical fingerprint identification system of claim 1, wherein the light emitting layer further comprises a display unit, the display unit comprises the light emitting element, and the light emitting element comprises an organic light emitting diode.

19. The optical fingerprint identification system of claim 1, wherein the light path adjusting element comprises a Fresnel lens element.

20. An optical fingerprint identification device, comprising:
- a plurality of light emitting elements, wherein the plurality of light emitting elements are disposed at equal intervals respectively in a first direction and a second direction, and the first direction is substantially perpendicular to the second direction;
- a plurality of light path adjusting elements, wherein the plurality of light path adjusting elements are located above the plurality of light emitting elements in a stack direction of the optical fingerprint identification device, the stack direction is substantially perpendicular to the first direction and the second direction, the plurality of light path adjusting elements are disposed at equal intervals in the first direction, and each of the plurality of light path adjusting elements is located between two adjacent light emitting elements of the plurality of light emitting elements in the first direction;
- a plurality of photo sensors, wherein the plurality of photo sensors are located below the plurality of light emitting elements in the stack direction, the plurality of photo sensors are disposed at equal intervals in the first direction, and each of the plurality of photo sensors is located between two adjacent light emitting elements of the plurality of light emitting elements in the first direction; and
- a plurality of light collecting elements, wherein the plurality of light collecting elements are disposed between the plurality of photo sensors and the plurality of light emitting elements;
- wherein the optical fingerprint identification device further comprises a light interference filter layer and a light absorption filter layer that are disposed above the plurality of photo sensors and below the plurality of light path adjusting elements, the light interference filter layer is configured to provide a filter bandwidth shift according to a change of an incident light angle thereon, the light absorption filter layer is a light passable filter layer, and the light absorption filter layer has a light passable bandwidth ranging between visible and near-infrared spectrum;
- wherein the light passable bandwidth through the light interference filter layer and the light absorption filter layer includes near-infrared spectral range;
- wherein the plurality of photo sensors, the plurality of light collecting elements, the plurality of light emitting elements and the plurality of light path adjusting elements are sequentially disposed along the stack direction of the optical fingerprint identification device;
- wherein each of the plurality of light emitting elements and corresponding one of the plurality of photo sensors are physically and electrically connected via a thin-film-transistor circuitry structure;
- wherein a full width at half maximum of a bandwidth of light passing through the light interference filter layer and the light absorption filter layer is FWHM, and the following condition is satisfied:

FWHM<100 [nm].

21. The optical fingerprint identification device of claim 20, wherein each of the light path adjusting elements and each of the photo sensors are substantially aligned in the stack direction.

22. The optical fingerprint identification device of claim 20, wherein the plurality of light collecting elements are a plurality of collimator units forming a collimator layer disposed above the plurality of photo sensors, and the collimator layer has a plurality of tubular holes.

* * * * *